(12) United States Patent
Cheng et al.

(10) Patent No.: US 11,088,079 B2
(45) Date of Patent: Aug. 10, 2021

(54) PACKAGE STRUCTURE HAVING LINE CONNECTED VIA PORTIONS

(71) Applicant: Taiwan Semiconductor Manufacturing Co., Ltd., Hsinchu (TW)

(72) Inventors: Chih-Kai Cheng, Hsinchu County (TW); Tsung-Shu Lin, New Taipei (TW); Tsung-Yu Chen, Hsinchu (TW); Hsien-Pin Hu, Zhubei (TW); Wen-Hsin Wei, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 47 days.

(21) Appl. No.: 16/454,410

(22) Filed: Jun. 27, 2019

(65) Prior Publication Data

US 2020/0411440 A1 Dec. 31, 2020

(51) Int. Cl.
*H01L 23/538* (2006.01)
*H01L 23/49* (2006.01)
(Continued)

(52) U.S. Cl.
CPC ........ *H01L 23/5384* (2013.01); *H01L 21/486* (2013.01); *H01L 21/4853* (2013.01); *H01L 23/49816* (2013.01); *H01L 23/5386* (2013.01); *H01L 23/5389* (2013.01); *H01L 24/16* (2013.01); *H01L 24/19* (2013.01); *H01L 24/24* (2013.01); *H01L 24/32* (2013.01); *H01L 24/73* (2013.01); *H01L 24/81* (2013.01); *H01L 24/83* (2013.01); *H01L 24/92* (2013.01); *H01L 25/0655* (2013.01); *H01L 25/105* (2013.01); *H01L 25/50* (2013.01); *H01L 2224/16227* (2013.01); *H01L 2224/16238* (2013.01); *H01L 2224/24225* (2013.01); *H01L 2224/32225* (2013.01); *H01L 2224/73204* (2013.01); *H01L 2224/73267* (2013.01); *H01L 2224/92125* (2013.01); *H01L 2224/92244* (2013.01);
(Continued)

(58) Field of Classification Search
CPC ........... H01L 23/5384; H01L 23/49816; H01L 23/5386; H01L 23/5389; H01L 24/16; H01L 24/19; H01L 24/24; H01L 24/73; H01L 25/103; H01L 25/105
See application file for complete search history.

(56) References Cited

U.S. PATENT DOCUMENTS 7,812,434 B2 * 10/2010 Yang ........................ H01L 24/19
257/684
7,911,044 B2 * 3/2011 Yang .................... H01L 23/5389
257/685
(Continued)

*Primary Examiner* — Ida M Soward
(74) *Attorney, Agent, or Firm* — Birch, Stewart, Kolasch & Birch, LLP

(57) ABSTRACT

A package structure includes a first through via structure formed in a substrate and a semiconductor die formed below the first through via structure. The package structure further includes a conductive structure formed in a passivation layer over the substrate. The conductive structure includes a first via portion and a second via portion, the first via portion is directly over the first through via structure, and there is no conductive material directly below and in direct contact with the second via portion.

20 Claims, 25 Drawing Sheets

(51) Int. Cl.
*H01L 25/10* (2006.01)
*H01L 23/498* (2006.01)
*H01L 21/48* (2006.01)
*H01L 23/00* (2006.01)
*H01L 25/00* (2006.01)
*H01L 25/065* (2006.01)

(52) U.S. Cl.
CPC .......... *H01L 2225/1035* (2013.01); *H01L 2225/1058* (2013.01)

(56) References Cited

U.S. PATENT DOCUMENTS

| | | | |
|---|---|---|---|
| 8,237,257 B2 * | 8/2012 | Yang | H01L 24/82 |
| | | | 257/692 |
| 8,993,380 B2 | 3/2015 | Hou et al. | |
| 9,024,429 B2 * | 5/2015 | Yap | H01L 23/13 |
| | | | 257/687 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,129 B2 * | 8/2017 | Chen | H01L 25/105 |
| 9,735,131 B2 | 8/2017 | Su et al. | |
| 9,899,248 B2 * | 2/2018 | Yu | H01L 21/6835 |
| 9,978,665 B2 * | 5/2018 | Marimuthu | H01L 24/19 |
| 10,049,953 B2 * | 8/2018 | Yu | H01L 24/24 |
| 10,325,853 B2 * | 6/2019 | Yu | H01L 21/56 |
| 10,707,094 B2 * | 7/2020 | Chen | H01L 23/5384 |
| 10,763,164 B2 * | 9/2020 | Chen | H01L 24/13 |
| 10,867,938 B2 * | 12/2020 | Tang | H01L 21/565 |
| 2013/0292851 A1 * | 11/2013 | Pagaila | H01L 24/25 |
| | | | 257/774 |
| 2017/0025359 A1 * | 1/2017 | Tsai | H01L 21/4857 |
| 2018/0156865 A1 * | 6/2018 | Chen | H01L 21/56 |
| 2018/0197837 A1 * | 7/2018 | Yu | H01L 21/56 |
| 2018/0226349 A1 * | 8/2018 | Yu | H01L 24/92 |
| 2018/0286776 A1 * | 10/2018 | Tai | H01L 24/24 |
| 2019/0006283 A1 * | 1/2019 | Wang | H01L 21/76879 |
| 2019/0096841 A1 * | 3/2019 | Liu | H01L 23/5384 |
| 2019/0148267 A1 * | 5/2019 | Chen | H01L 25/105 |
| | | | 257/737 |
| 2019/0244935 A1 * | 8/2019 | Yu | H01L 23/3128 |
| 2019/0326255 A1 * | 10/2019 | Olson | H01L 24/94 |
| 2020/0075562 A1 * | 3/2020 | Yu | H01L 24/97 |
| 2020/0083145 A1 * | 3/2020 | Hung | H01L 21/486 |
| 2020/0111749 A1 * | 4/2020 | Lin | H01L 24/24 |
| 2020/0219832 A1 * | 7/2020 | Marimuthu | H01L 24/20 |
| 2020/0220250 A1 * | 7/2020 | Chih | H01L 21/56 |
| 2020/0227310 A1 * | 7/2020 | Chen | H01L 25/105 |
| 2020/0273806 A1 * | 8/2020 | Chiang | B23K 26/0006 |
| 2020/0365570 A1 * | 11/2020 | Chen | H01L 25/0652 |
| 2020/0399117 A1 * | 12/2020 | Lin | H01L 24/19 |
| 2021/0013151 A1 * | 1/2021 | Yu | H01L 23/5226 |
| 2021/0082824 A1 * | 3/2021 | Yu | H01L 21/486 |

\* cited by examiner

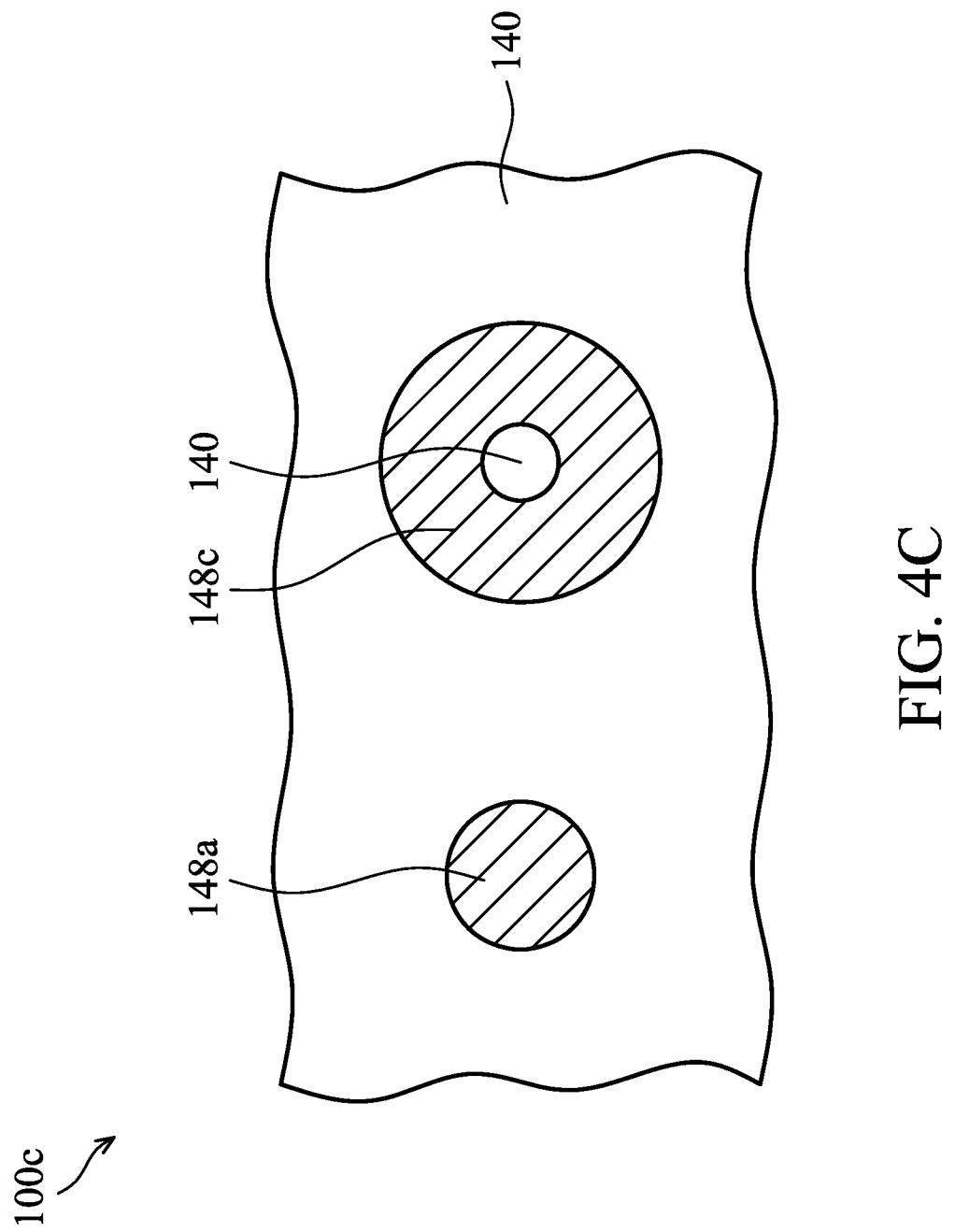

PACKAGE STRUCTURE HAVING LINE CONNECTED VIA PORTIONS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions can be integrated together.

Although existing package structures and methods of fabricating a package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1I' shows a cross-sectional representation of a package structure, in accordance with some embodiments of the disclosure.

FIG. 4C shows a top-view representation of the first via portion and the second via portion taken along line C-C' of FIG. 4B, in accordance with some embodiments of the disclosure.

DETAILED DESCRIPTION

Figure 1A:
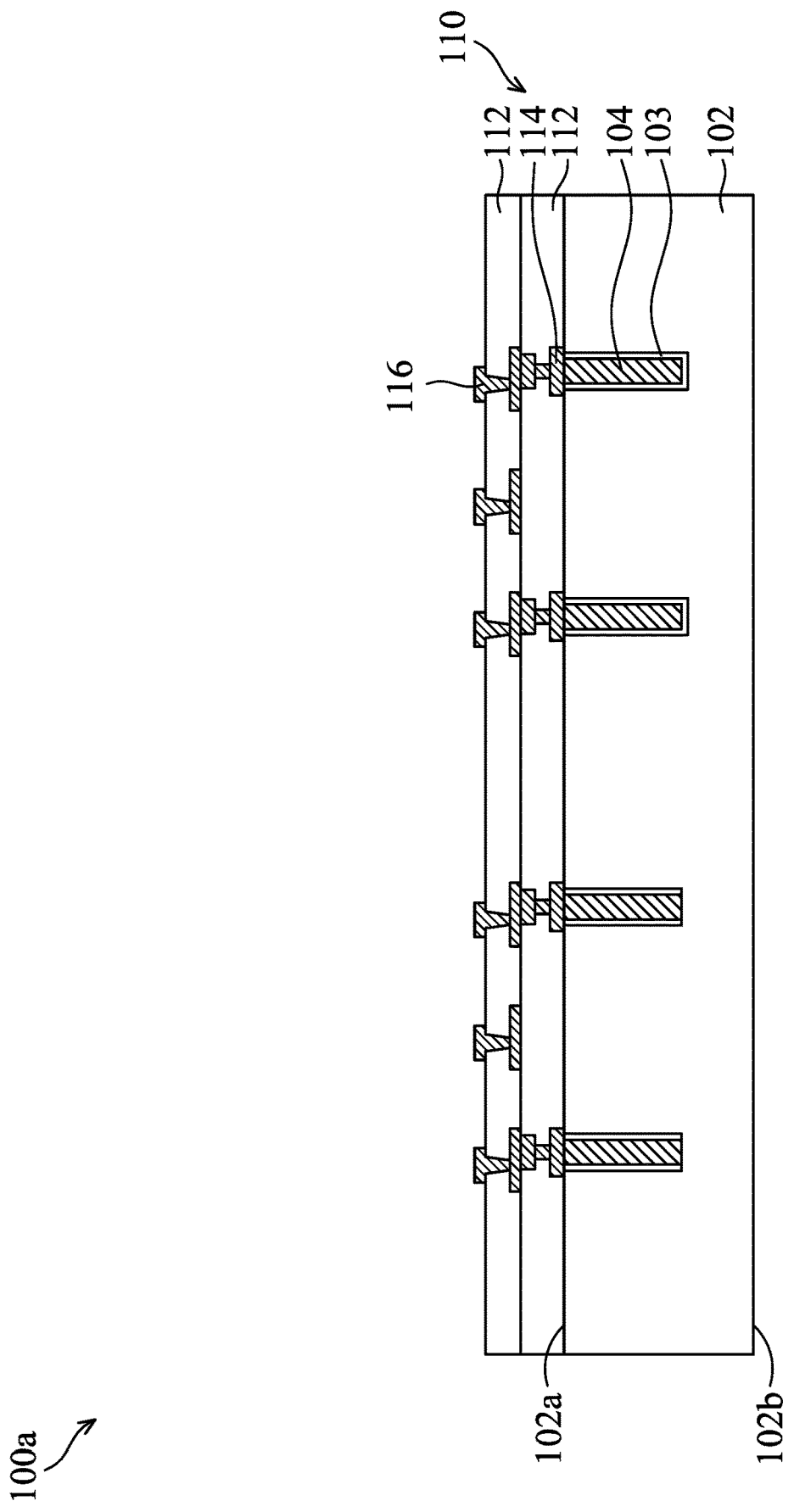
FIGS. 1A-1I show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a package structure and method for forming the same are provided. FIGS. 1A-1I show cross-sectional representations of various stages of forming a package structure 100a, in accordance with some embodiments of the disclosure. The package structure 100a may be a chip-on-wafer-on-substrate (CoWoS) package or another suitable package. The package structure 100a includes a through via structure over a semiconductor die, and a conductive structure formed over the through via structure. The conductive structure includes a first via portion and a second via portion. The first via portion has two ends for connecting, but the second via portion has one end for connecting. The formation of the second via portion is used to reduce stress and to prevent the formation of cracks and voids.

As shown in FIG. 1A, a substrate 102 is provided. The substrate 102 includes a front surface 102a and a back surface 102b. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of conductive structures 104 are formed in the substrate 102. The conductive structures 104 extend from the front surface 102a of the substrate 102 towards the back surface 102b of the substrate 102. In some embodiments, the conductive structures 104 are formed by forming a number of trenches (not shown) which extend from the front surface 102a of the substrate 102. Afterwards, a barrier layer 103 is filled into each of the trenches, and the conductive structure 104 is formed on the barrier layer 103 and in each of the trenches.

An interconnect structure 110 is formed over the conductive structures 104 and the substrate 102. The interconnect structure 110 may be used as a redistribution (RDL) structure for routing. The interconnect structure 110 includes multiple conductive layers 114 and conductive pads 116 formed in multiple dielectric layers 112. In some embodiments, the conductive pads 116 are exposed at or protruding from the top surface of the top of the dielectric layers 112 to serve as bonding pads.

The dielectric layers 112 may be made of or include one or more polymer materials. The polymer material(s) may include polybenzoxazole (PBO), polyimide (PI), one or more other suitable polymer materials, or a combination thereof. In some embodiments, some or all of the dielectric layers 112 are made of or include dielectric materials other than polymer materials. The dielectric material may include silicon oxide, silicon carbide, silicon nitride, silicon oxynitride, one or more other suitable materials, or a combination thereof.

The conductive layers 114 and the conductive pads 116 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive layers 114 and the conductive pads 116 are formed by an electroplating, electroless plating, printing, a chemical vapor deposition (CVD) process, or a physical vapor deposition (PVD) process.

Figure 1B:
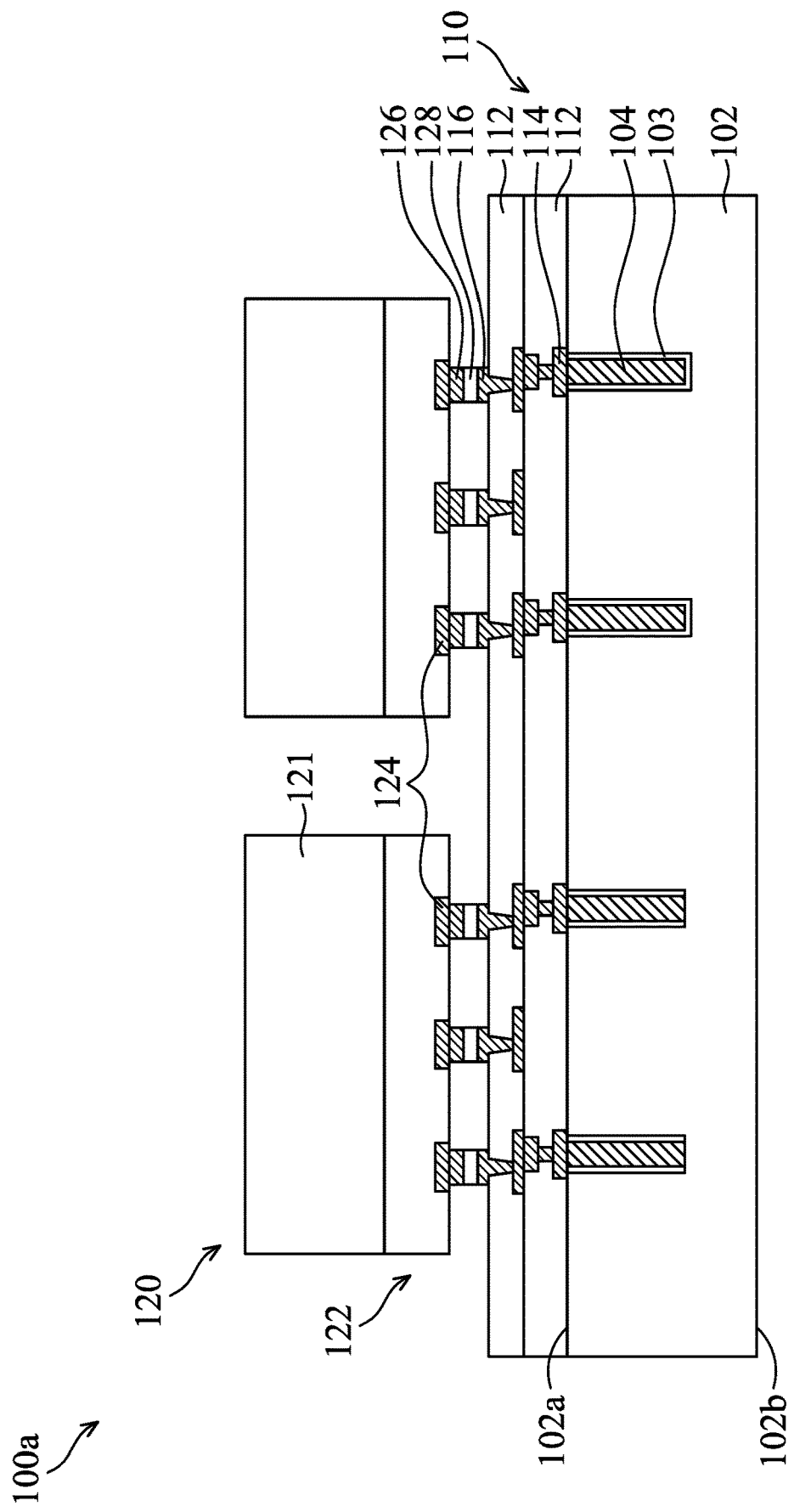

Afterwards, as shown in FIG. 1B, a semiconductor die 120 is formed over the conductive layer 116, in accordance with some embodiments of the disclosure. The semiconductor die 120 includes a substrate 121 and an interconnect structure 122 over the substrate 121. The interconnect structure 122 of the semiconductor die 120 includes a number of conductive layers 124.

In some embodiments, the semiconductor die 120 is sawed from a wafer, and may be a "known-good-die". The semiconductor die 120 may be a system-on-chip (SoC) chip or memory die. In some other embodiments, the semiconductor die 120 is a system on integrated circuit (SoIC) device that includes two or more chips with integrated functions. In some embodiments, the memory die includes a static random access memory (SRAM) device, a dynamic random access memory (DRAM) device, a high bandwidth memory (HBM) or another memory dies. The number of semiconductor dies 120 is not limited to two, and the number can be adjusted according to actual application.

In some embodiments, a number of conductive pads 126 are formed below the conductive layers 124 of the semiconductor die 120, and each of the conductive pads 126 is bonded to each of the conductive pads 116 through a number of conductive connectors 128.

The conductive pads 126 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 126 is formed by an electroplating, electroless plating, printing, a chemical vapor deposition (CVD) process, or a physical vapor deposition (PVD) process.

The conductive connector 128 is made of solder materials, such as tin (Sn), tin-silver (SnAg), tin-lead (SnPb), tin-copper (SnCu), tin-silver-copper (SnAgCu), tin-silver-zinc (SnAgZn), tin-zinc (SnZn), tin-bismuth-indium (SnBiIn), tin-indium (SnIn), tin-gold (SnAu), tin-zinc-indium (SnZnIn), tin-silver-Antimony (SnAgSb) or another applicable material. In some embodiments, the conductive connector 128 is formed by electroplating, electroless plating, printing, a chemical vapor deposition (CVD) process, or a physical vapor deposition (PVD) process.

Figure 1C:
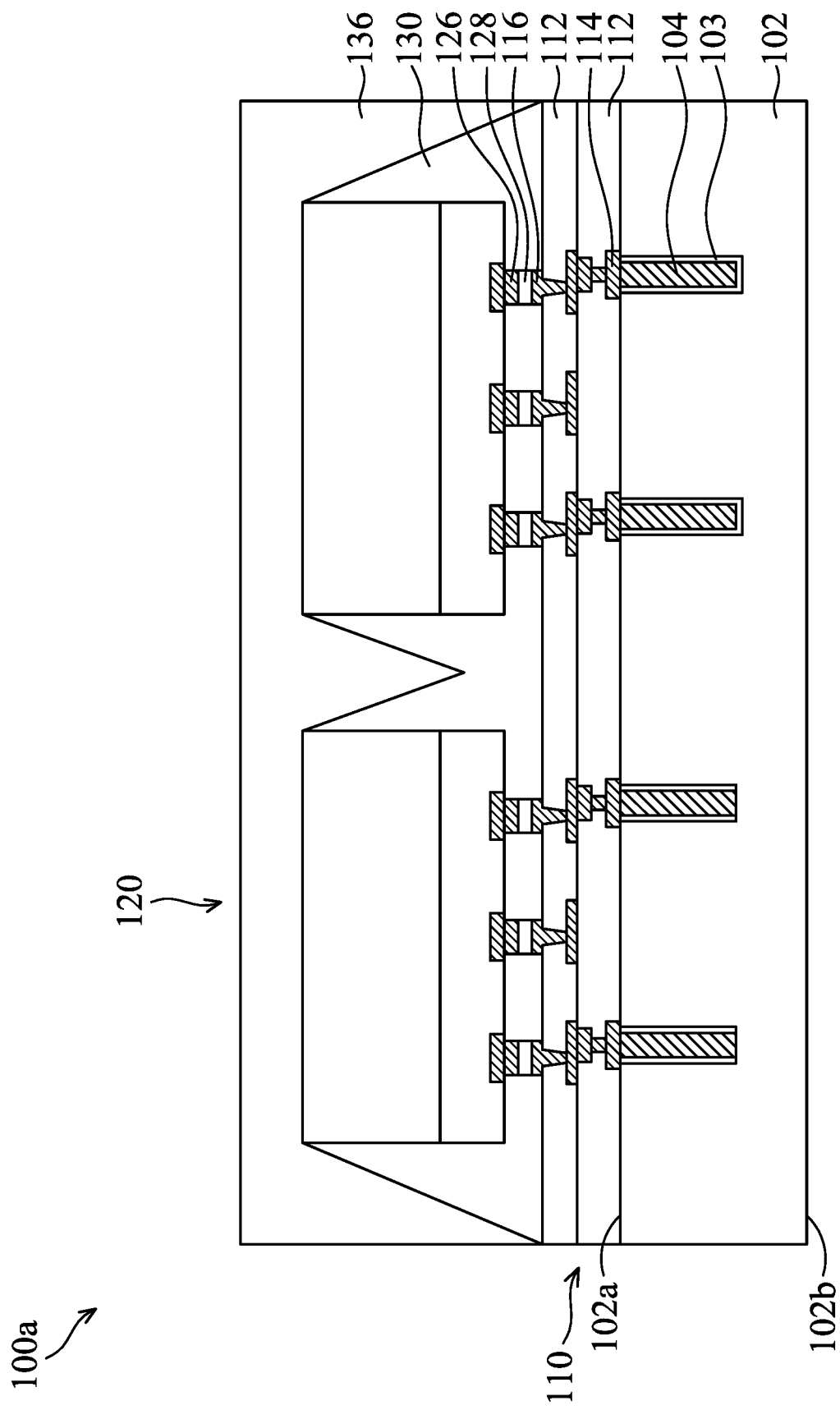

Next, as shown in FIG. 1C, an underfill layer 130 is formed between the semiconductor die 120 and the interconnect structure 110, in accordance with some embodiments of the disclosure. The underfill layer 130 surrounds and protects the conductive connectors 128. In some embodiments, the underfill layer 130 is in direct contact with the conductive connectors 128.

In some embodiments, the underfill layer 130 is made of or includes a polymer material. The underfill layer 130 may include an epoxy-based resin. In some embodiments, the underfill layer 130 includes fillers dispersed in the epoxy-based resin.

In some embodiments, the formation of the underfill layer 130 involves an injecting process, a spin-on process, a dispensing process, a film lamination process, an application process, one or more other applicable processes, or a combination thereof. In some embodiments, a thermal curing process is used during the formation of the underfill layer 130.

Afterwards, a package layer 136 is formed over the underfill layer 130. There is an interface between the underfill layer 130 and the package layer 136, and the interface is lower than the top surface of the semiconductor die 120. The package layer 136 surrounds and protects the semiconductor dies 120. In some embodiments, the package layer 136 is in direct contact with portions of the semiconductor dies 120.

The package layer 136 is made of a molding compound material. The molding compound material may include a polymer material, such as an epoxy-based resin with fillers dispersed therein. In some embodiments, a liquid molding compound material is applied over the semiconductor dies 120. The liquid molding compound material may flow into a space between the semiconductor dies 120. A thermal process is then used to cure the liquid molding compound material and to transform it into the package layer 136.

Figure 1D:
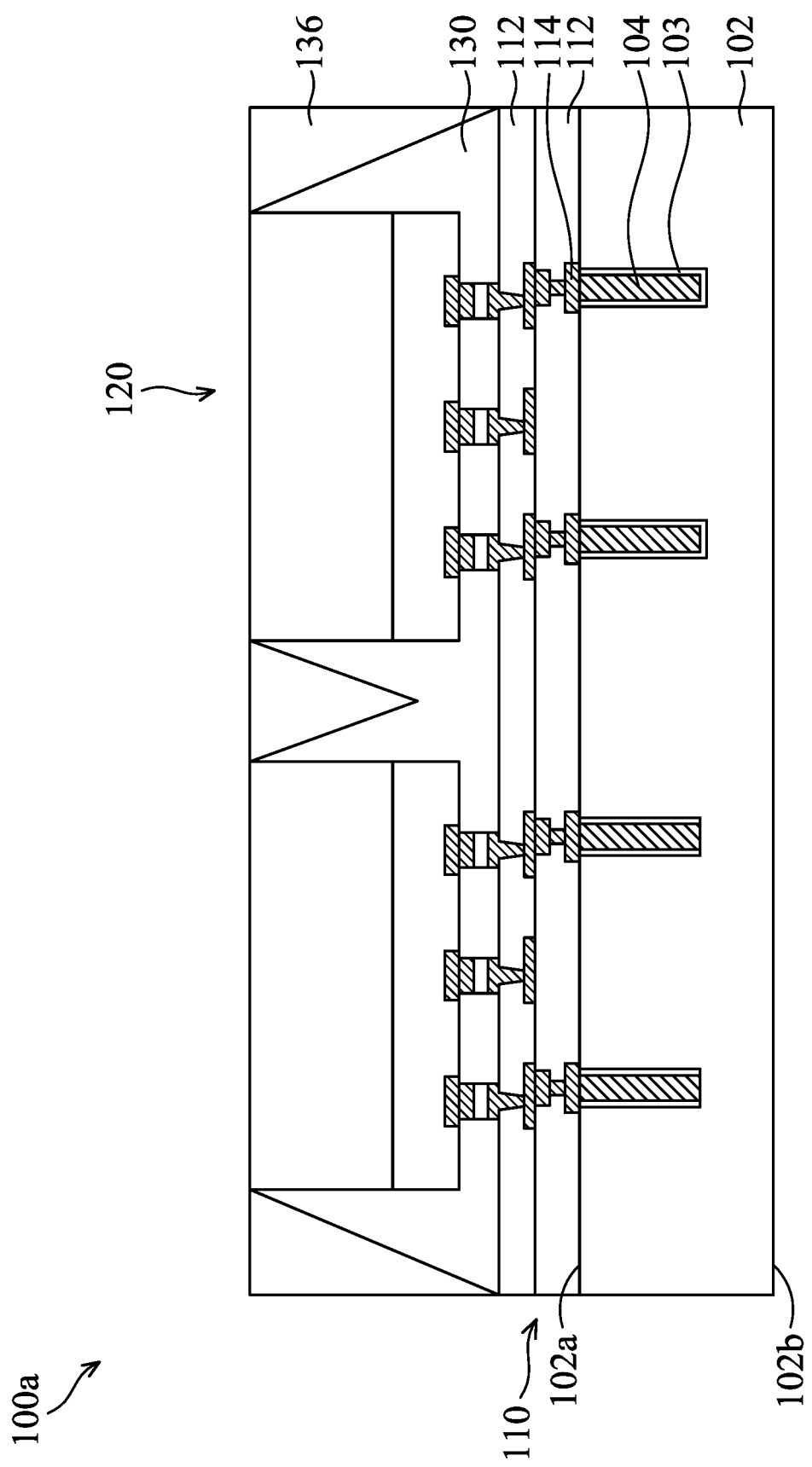

Afterwards, as shown in FIG. 1D, a portion of the package layer 136 is removed, in accordance with some embodiments of the disclosure. As a result, the top surface of the semiconductor dies 120 is exposed. The top surface of the semiconductor die 120 is substantially level with the top surface of the package layer 136. Where applicable, the term "substantially" may also relate to 90% or higher, such as 95% or higher, especially 99% or higher, including 100%.

In some embodiments, the package layer 136 is thinned using a planarization process. The planarization process may include a chemical mechanical polishing (CMP) process, a grinding process, an etching process, another applicable process, or a combination thereof.

Figure 1E:
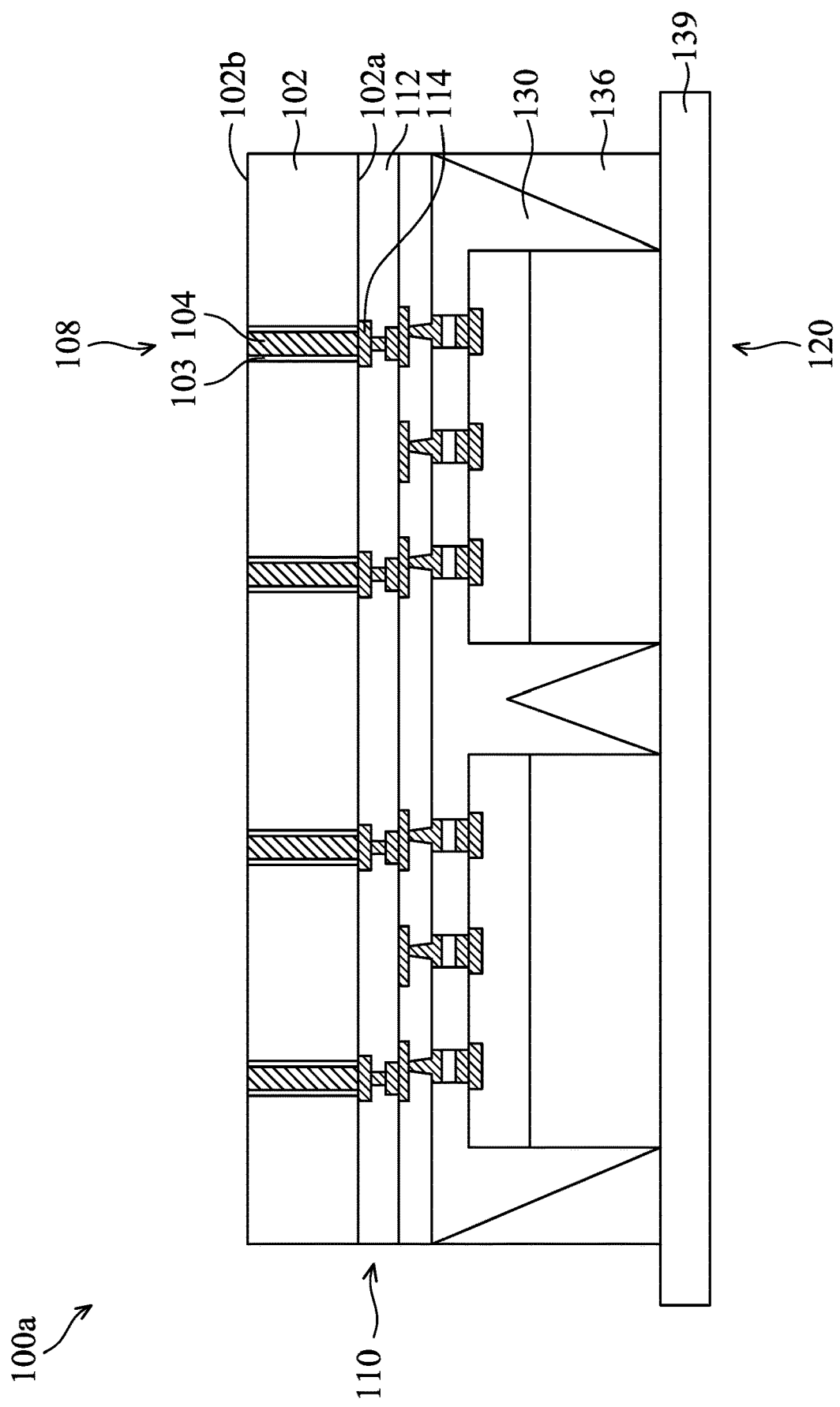

Next, as shown in FIG. 1E, the substrate 102 is turned upside down and placed over a carrier substrate 139, in accordance with some embodiments. In some embodiments, the carrier substrate 139 is used as a temporary substrate. The temporary substrate provides mechanical and structural support during subsequent processing steps, such as those described in more detail later. The carrier substrate 139 is made of a semiconductor material, ceramic material, polymer material, metal material, another suitable material, or a combination thereof. In some embodiments, the carrier substrate 139 is a glass substrate. In some other embodiments, the carrier substrate 139 is a semiconductor substrate, such as a silicon wafer.

Afterwards, the substrate 102 is thinned using the carrier substrate 139 as support. In some embodiments, the substrate 102 is thinned from the back surface 102b until the conductive structures 104 are exposed. In some embodiments, the conductive structures 104 and the barrier layer 103 become exposed and penetrate through the thinned substrate 102. As a result, a through via structure 108 is formed in the substrate 102. In some embodiments, the through via structure 108 is a through substrate via (TSV) structure. In some other embodiments, the through via structure 108 may be referred to as through-silicon via.

Figure 1F:
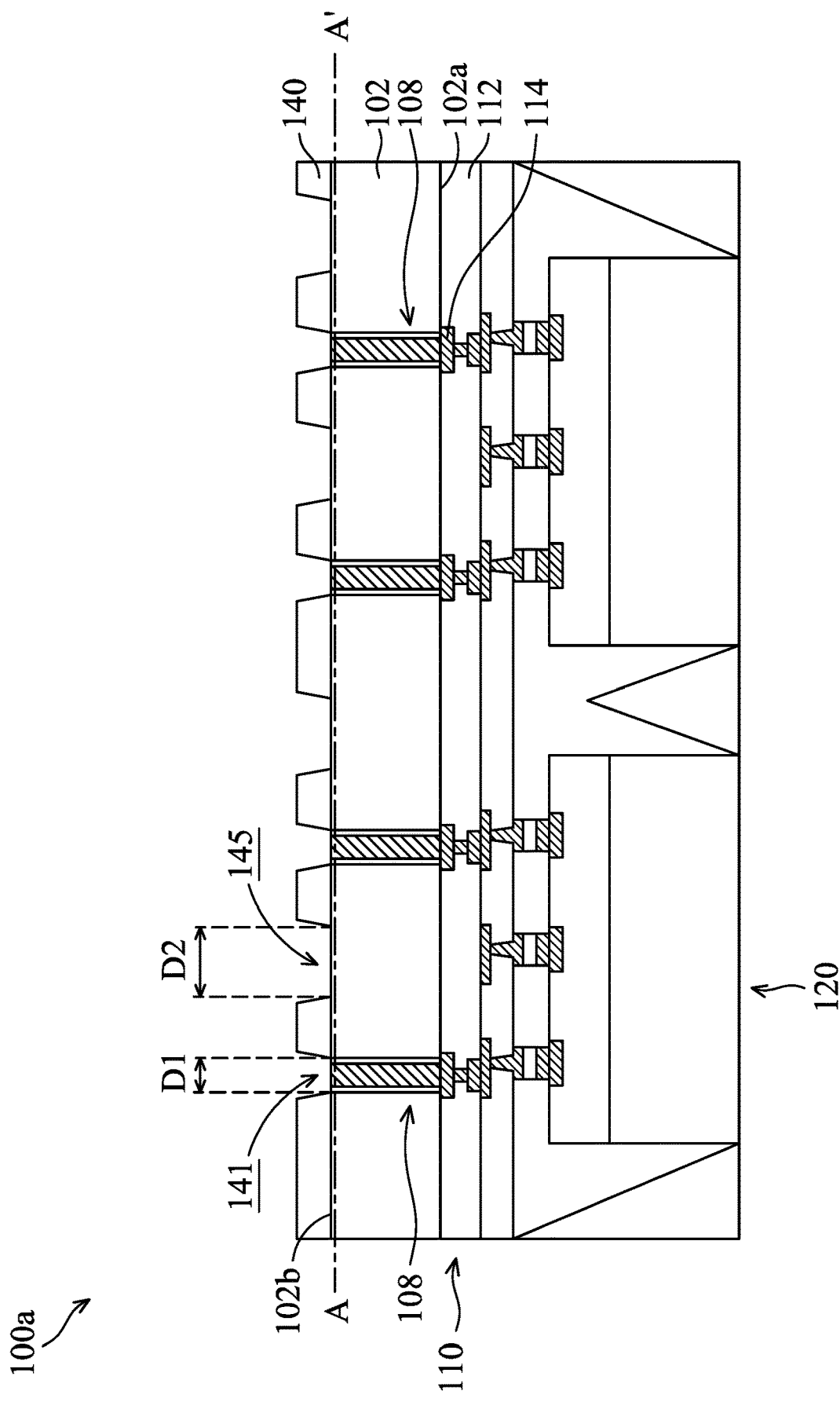

Afterwards, as shown in FIG. 1F, the carrier substrate 139 is removed, and a first passivation layer 140 is formed over the back surface 102b of the substrate 102, in accordance with some embodiments of the disclosure. A first opening 141 is formed in the first passivation layer 140 to expose the through via structure 108, and a second opening 145 is formed in the first passivation layer 140 to expose the substrate 102. The first opening 141 has sloped sidewall surfaces, and the second opening 145 also has sloped sidewall surfaces.

The first passivation layer 140 is made of poly(p-phenylene-2,6-benzoxazole) (PBO), benzocyclobutene (BCB), silicone, acrylates, siloxane, another suitable material, or a combination thereof. In some other embodiments, the first passivation layer 140 is made of non-organic materials. The non-organic materials include silicon oxide, un-doped silicate glass, silicon oxynitride, silicon nitride, silicon carbide, another suitable material, or a combination thereof. In some embodiments, the first passivation layer 140 is formed by a deposition process, such as a physical vapor deposition (PVD) process, a chemical vapor deposition (CVD) process, or another applicable process.

The first opening 141 and the second opening 145 are formed by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 2A:
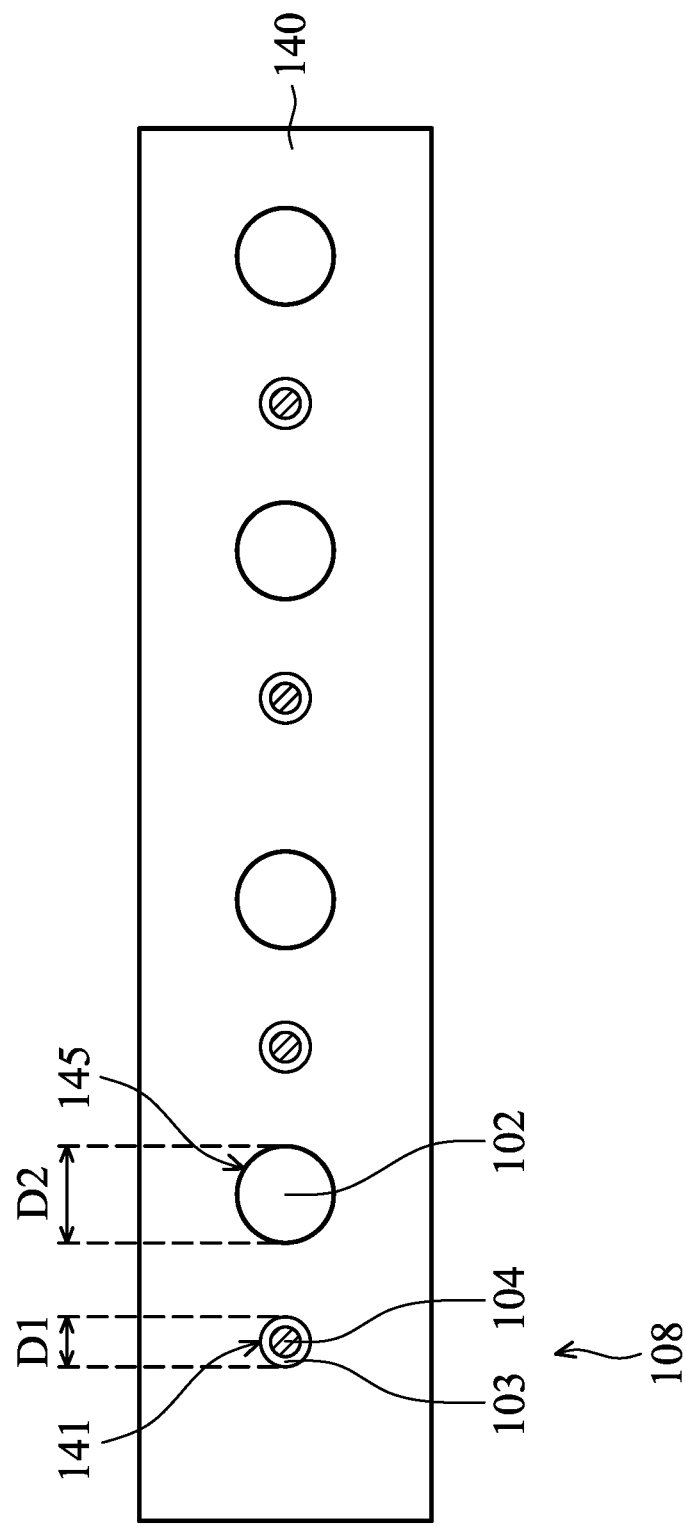
FIG. 2A shows a top-view representation of the first opening and the second opening taken along line A-A' of FIG. 1F, in accordance with some embodiments of the disclosure.

FIG. 2A shows a top-view representation of the first opening 141 and the second opening 145 taken along line A-A' of FIG. 1F, in accordance with some embodiments of the disclosure.

The first opening 141 has a circular shape when seen from a top-view, and the second opening 145 has a circular shape when seen from a top-view. A diameter of the first opening 141 tapers gradually from top to bottom, and a diameter of the second opening 145 tapers gradually from top to bottom. In some embodiments, a bottom surface of the first opening 141 has a first diameter $D_1$, and a bottom surface of the second opening 145 has a second diameter $D_2$. The second diameter $D_2$ is greater than the first diameter $D_1$. In some embodiments, the first diameter $D_1$ of the bottom surface of the first opening 141 is in a range from about 15 μm to about 20 μm. In some embodiments, the second diameter $D_2$ of the bottom surface of the second opening 145 is in a range from about 40 μm to about 50 μm.

Figure 1G:
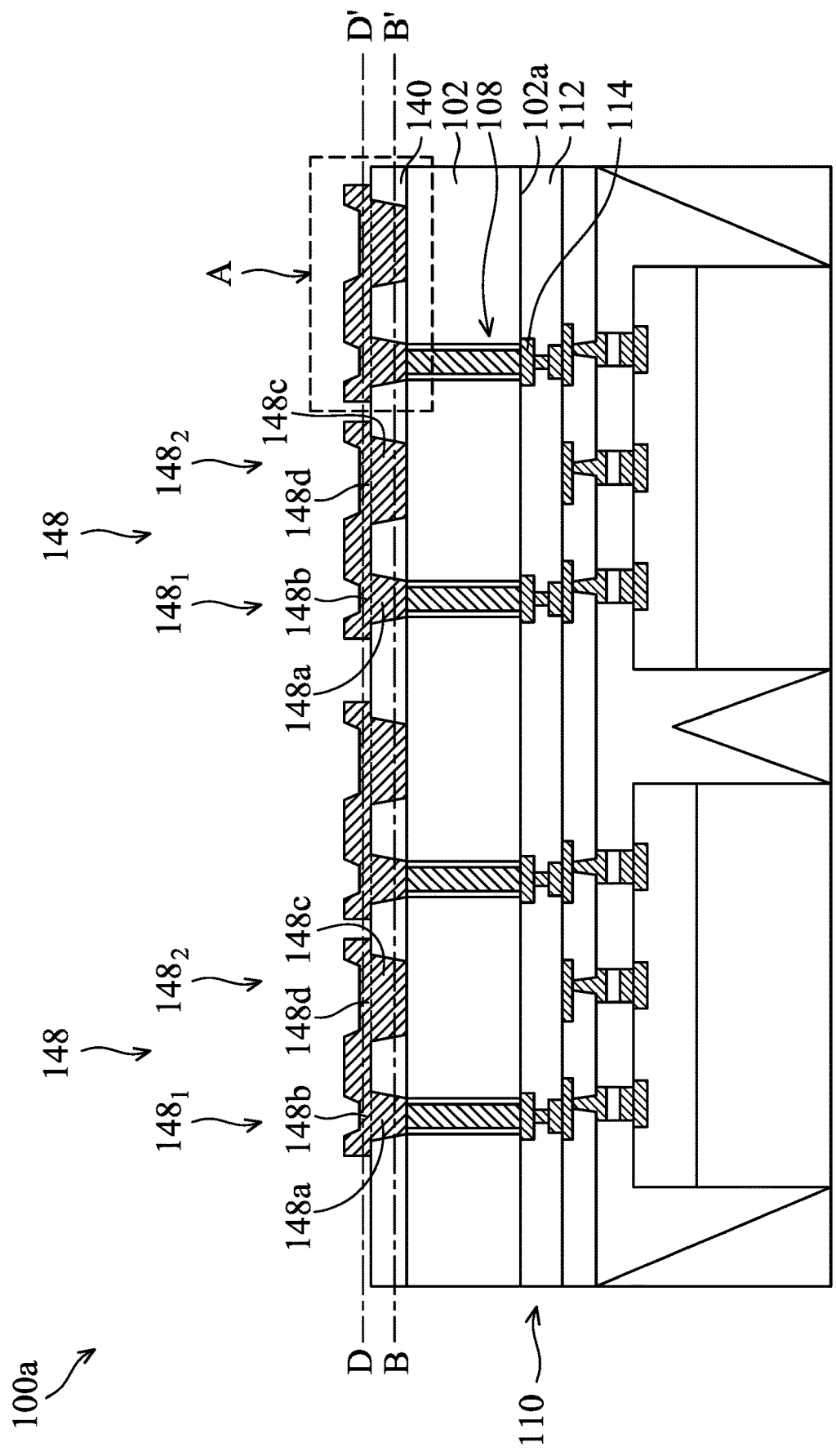

Next, as shown in FIG. 1G, a conductive material is formed in the first opening 141 and the second opening 145 to form a conductive structure 148, in accordance with some embodiments of the disclosure. As a result, the conductive structure 148 includes a first portion $148_1$ and a second portion $148_2$. The first portion $148_1$ includes a first via portion 148a in the first opening 141, and a first metal portion 148b on the first via portion 148a. The second portion $148_2$ includes a second via portion 148c in the second opening 145, and a second metal portion 148d on the second via portion 148c. The bottom surface of the first via portion 148a is level with the bottom surface of second via portion 148c. The dot line shown in FIG. 1G is drawn to provide a better understanding of the structure, but there is no actual interface or boundary between the first via portion 148a and the first metal portion 148b, and between the second via portion 148c and the second metal portion 148d.

It should be noted that the first via portion 148a has a first end and a second end in a vertical direction, the first end is in direct contact with the through via structure 108, and the second end is in direct contact with the first metal portion 148b. The second via portion 148c has a first end and a second end in a vertical direction, the first end is in direct contact with the substrate 102, and the second end is in direct contact with the second metal portion 148d. The first metal portion 148b is physically and electrically connected to the second metal portion 148d. The second via portion 148c is electrically connected to the through via structure 108 by the second metal portion 148d, the first metal portion 148b and the first via portion 148a.

It should be noted that the first via portion 148a has two ends to electrically connect to other conductive material, but the second via portion 148c has one end to electrically connect to other conductive material. The entirety of the bottom surface of the second via portion 148c is in direct contact with the substrate 102. Therefore, no conductive layer or material is directly below and in direct contact with the second via portion 148c. The bottom surface of the second via portion 148c is not direct contact with a conductive material or layer. The first metal portion 148b has a recessed top surface, and the second metal portion 148d also has a recessed top surface. The second via portion 148c is between two adjacent through via structures 108.

After the conductive material is formed in the first opening 141, the second opening 145 and over the substrate 102, a portion of the conductive material is removed to form the conductive structure 148 by an etching process, such as a dry etching process, or a wet etching process.

The conductive material may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive material is formed by an electroplating, electroless plating, printing, a chemical vapor deposition (CVD) process, or a physical vapor deposition (PVD) process.

Figure 2B:
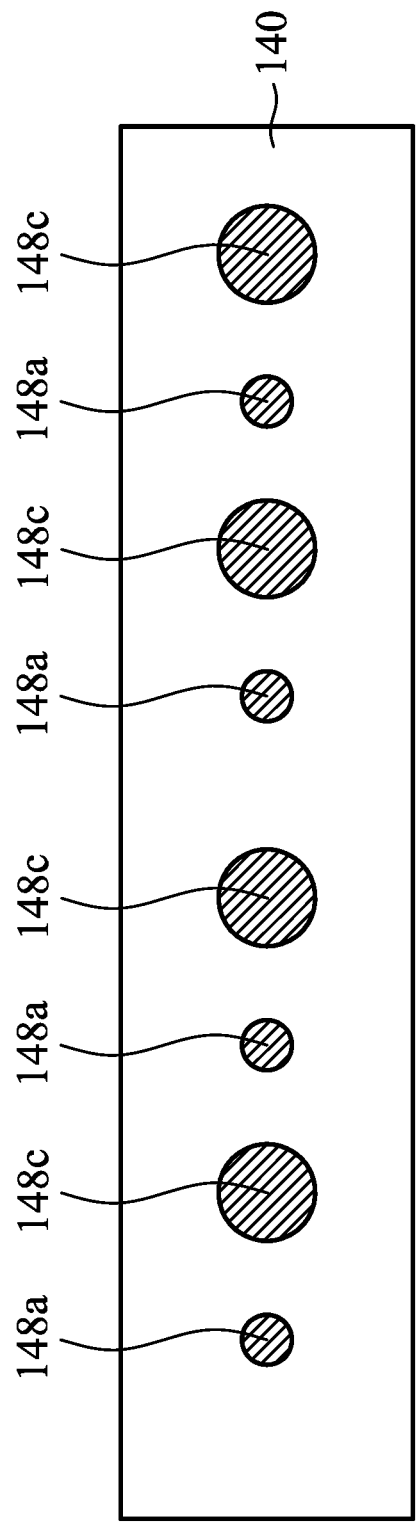
FIG. 2B shows a top-view representation of the first via portion and the second via portion taken along line B-B' of FIG. 1G, in accordance with some embodiments of the disclosure.

FIG. 2B shows a top-view representation of the first via portion 148a and the second via portion 148c taken along line B-B' of FIG. 1G, in accordance with some embodiments of the disclosure.

As shown in FIG. 2B, the second via portion 148c is separated from the first via portion 148a by the first passivation layer 140 along line B-B' in a horizontal direction. The width or the diameter of the second via portion 148c is greater than the width or the diameter of the first via portion 148a.

Figure 2C:
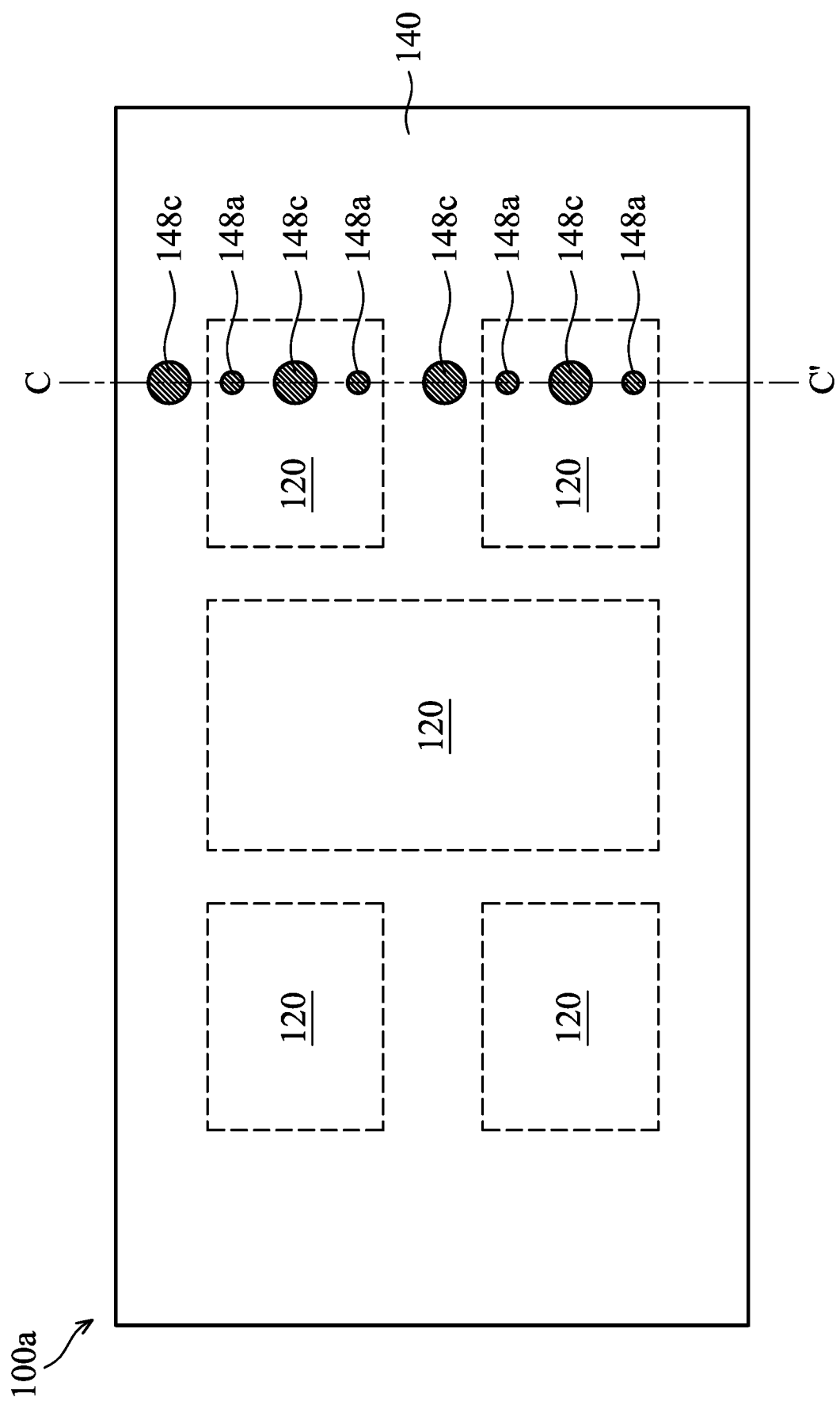
FIG. 2C shows a top-view representation of the first via portion and the second via portion, in accordance with some embodiments of the disclosure.

FIG. 2C shows a top-view representation of the first via portion 148a and the second via portion 148c, in accordance with some embodiments of the disclosure. FIG. 1G shows a cross-sectional representation taken along line C-C' of FIG. 2C, in accordance with some embodiments of the disclosure. FIG. 2B is a portion of FIG. 2C, and FIG. 2C shows the positional relationship between the second via portion 148c and the semiconductor die 120.

As shown in FIG. 2C, in some embodiments, the second via portion 148c is located at peripheral region which is outside of the semiconductor die 120. The second via portion 148c is located at the corner of the semiconductor die 120. In some embodiments, the second via portion 148c is located at a middle portion between two adjacent semiconductor dies 120. In some other embodiments, the second via portion 148c is located directly on the semiconductor die 120.

Figure 2D:
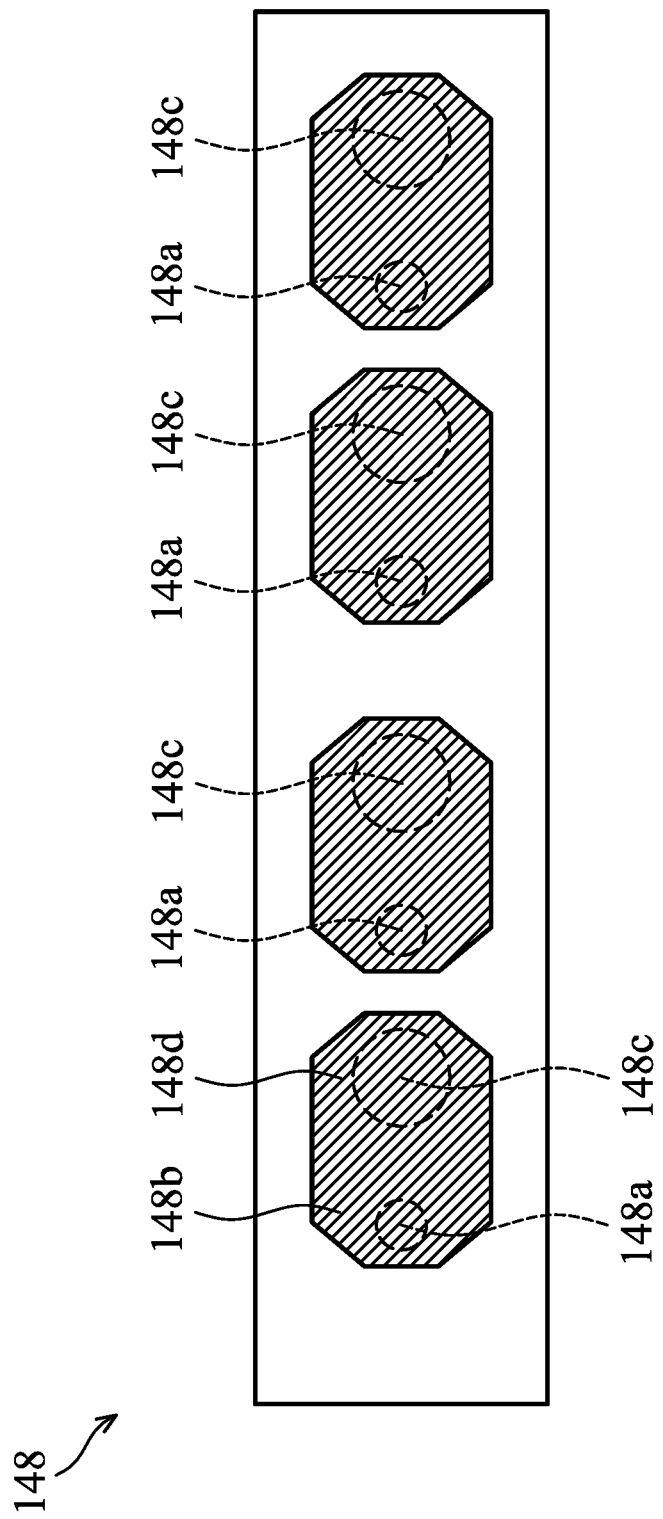
FIG. 2D shows a top-view representation of the first via portion and the second via portion along line D-D' of FIG. 1G, in accordance with some embodiments of the disclosure.

FIG. 2D shows a top-view representation of the first via portion 148a and the second via portion 148c along line D-D' of FIG. 1G, in accordance with some embodiments of the disclosure.

As shown in FIG. 2D, the first metal portion 148b and the second metal portion 148d forms a polygonal shape, such as octagonal shape, when seen from a top-view. The first metal portion 148a overlaps the through via structure 108. The first metal portion 148b and the second metal portion 148d cover the first via portion 148a and the second via portion 148c. More specifically, the first via portion 148a (shown in dash lines) and the second via portion 148c (shown in dash lines) are directly below the first metal portion 148a and the second metal portion 148d.

Figure 3:
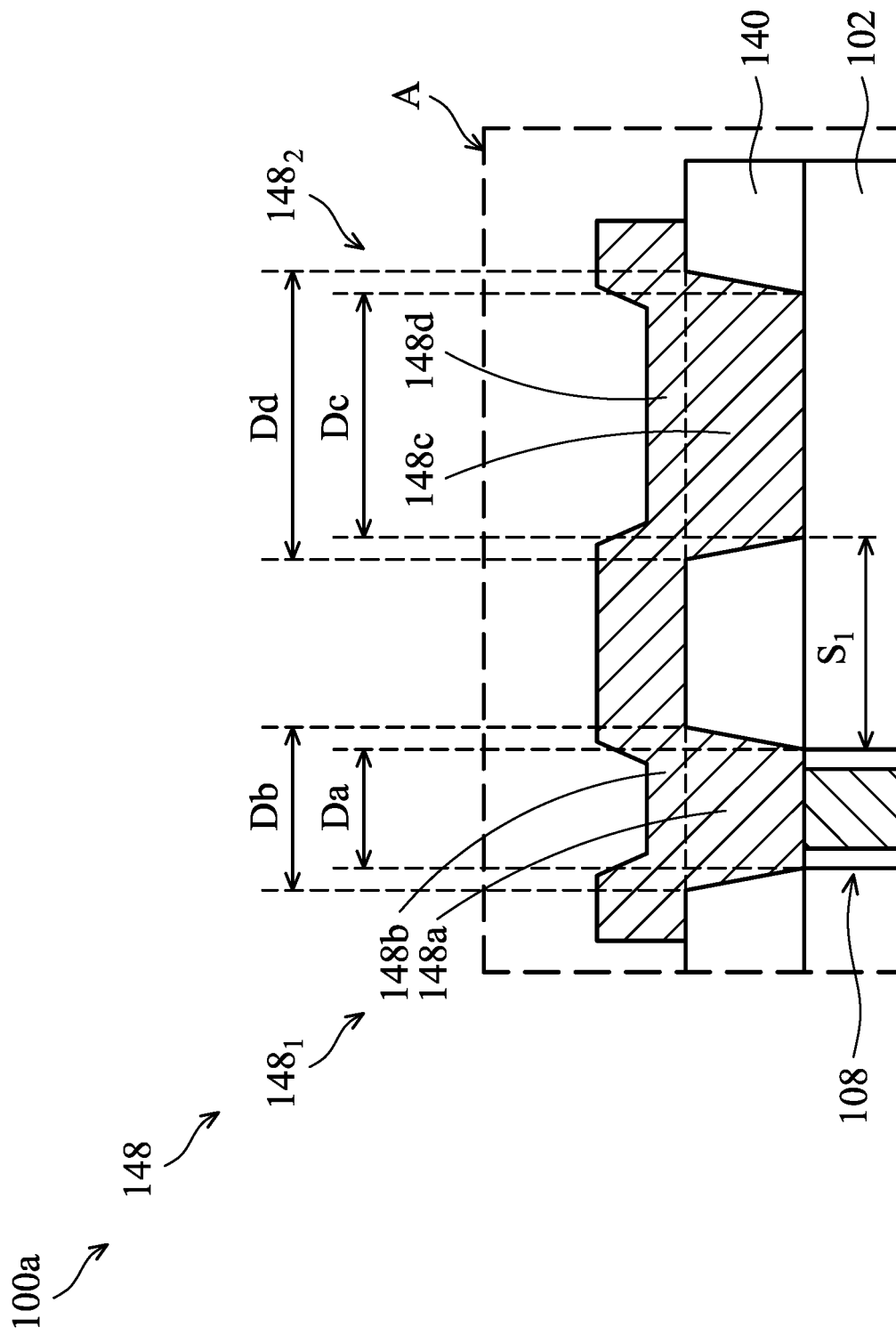
FIG. 3 shows an enlarged representation of the region A in FIG. 1G, in accordance with some embodiments of the disclosure.

FIG. 3 shows an enlarged representation of the region A in FIG. 1G, in accordance with some embodiments of the disclosure. The bottom surface of first via portion 148a has a first diameter Da, and the bottom surface of the first metal portion 148b has a second diameter Db. The bottom surface of the second via portion 148c has a third diameter Dc, and the bottom surface of the second metal portion 148d has a fourth diameter Dd. The first diameter Da is smaller than the third diameter Dc, and the second diameter Db is smaller than the fourth diameter Dd. The second diameter Db is smaller than the third diameter Dc. In some embodiments, the first diameter Da is in a range from about 15 μm to about 20 μm, and the second diameter Db is in a range from about 18 μm to about 23 μm. In some embodiments, the third diameter Dc is in a range from about 40 μm to about 50 μm, and the fourth diameter Dd is in a range from about 45 μm to about 55 μm.

There is a first distance $S_1$ between the edge of the first via portion 148a and the edge of the second via portion 148c. In some embodiments, the first distance $S_1$ is smaller than the diameter of the second via portion 148c of the conductive structure 148. In some embodiments, the first distance $S_1$ is in a range from about 10 μm to about 15 μm. If the first distance $S_1$ is smaller than 10 μm, the stress generated in the first via portion 148a and the stress generated in the second first via portion 148c may not be balanced, and causing unwanted cracks. If the first distance is greater than 15 μm, the size of the conductive structure 148 may be too large and take up too much of the routing area.

Figure 1H:
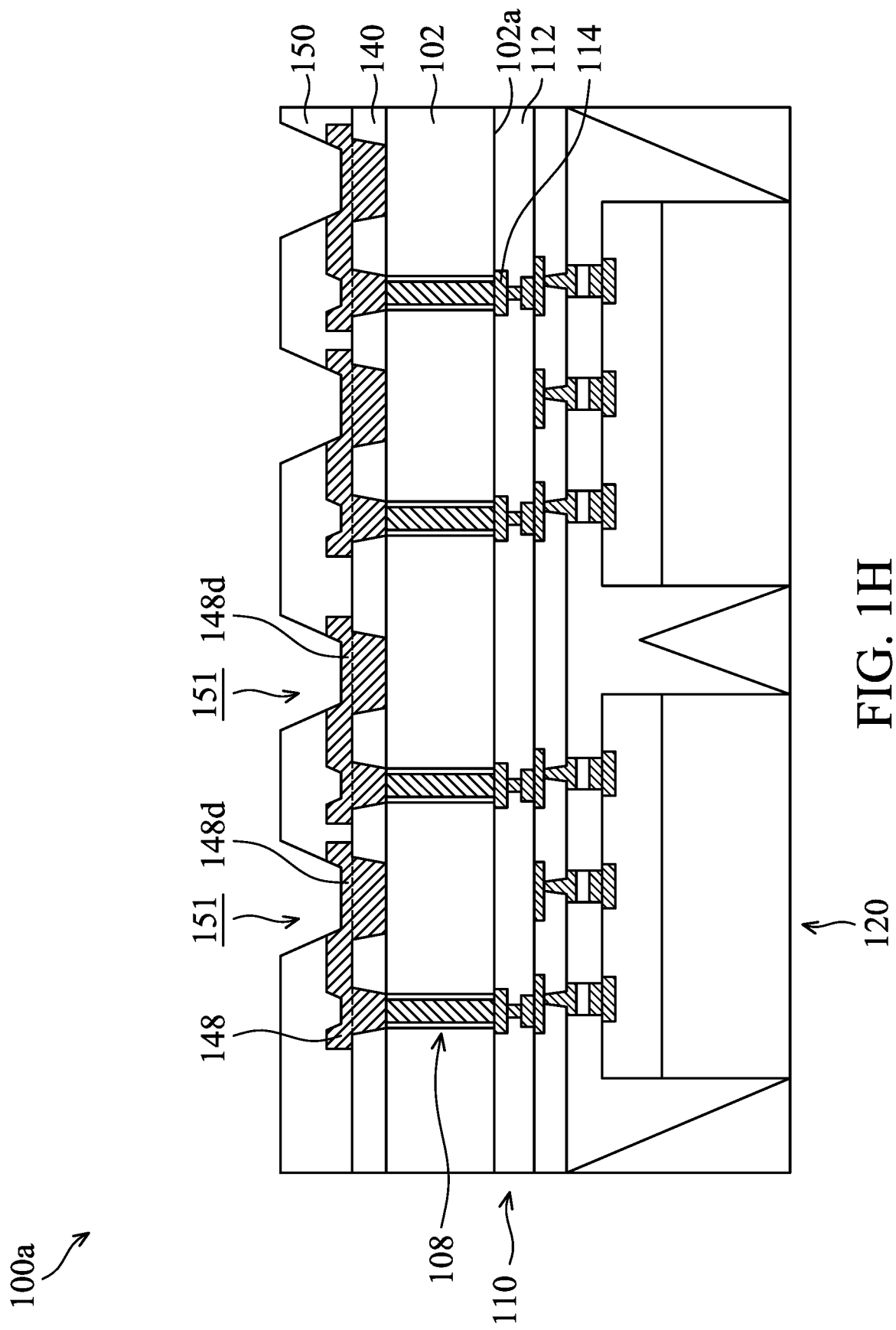

Afterwards, as shown in FIG. 1H, a second passivation layer 150 is formed over the first passivation layer 140 and on the conductive structure 148, in accordance with some embodiments of the disclosure. Afterwards, a portion of the second passivation layer 150 is removed to form a third opening 151. The third opening 151 is directly over the second metal portion 148d.

Figure 1I:
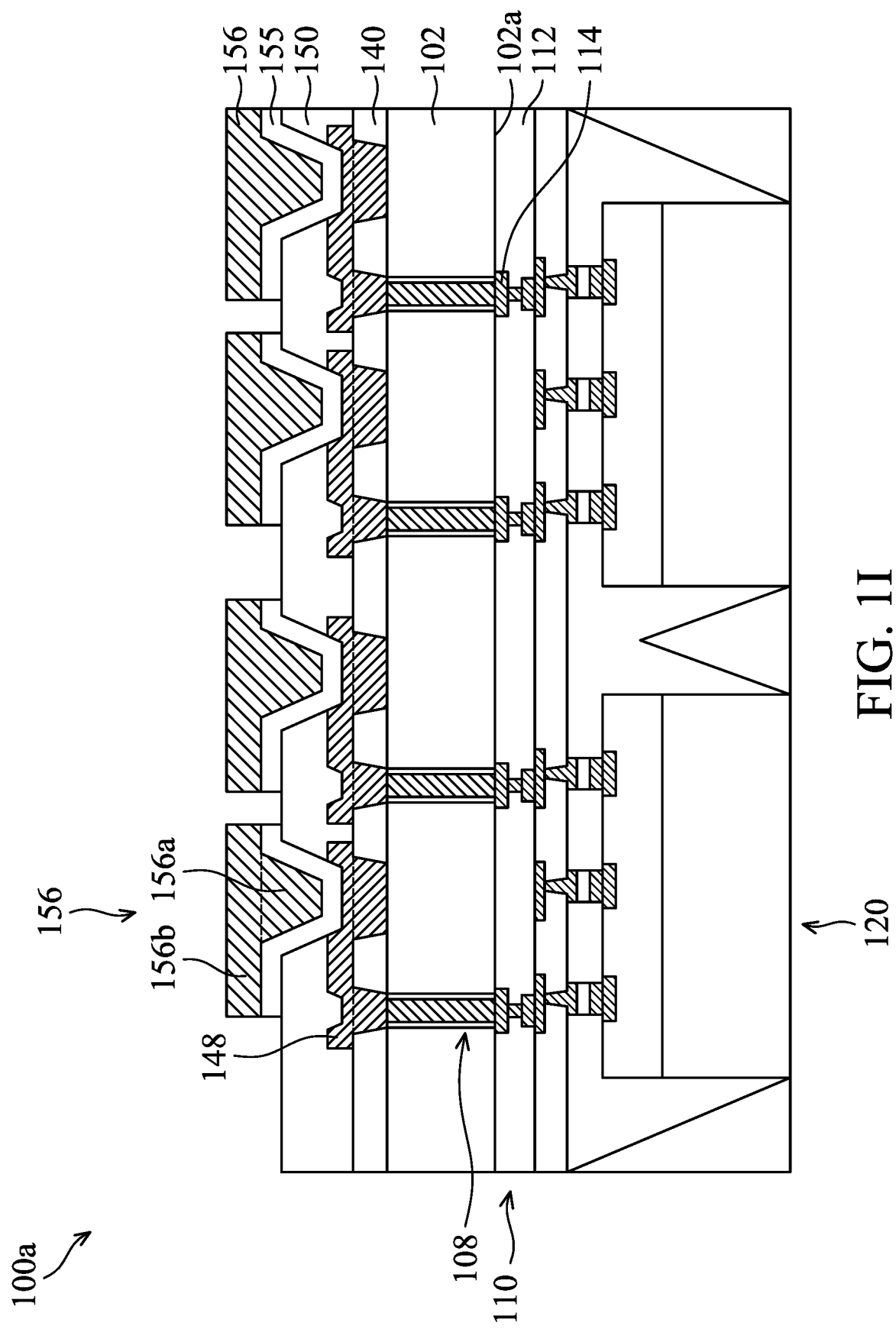
Figure 1I:
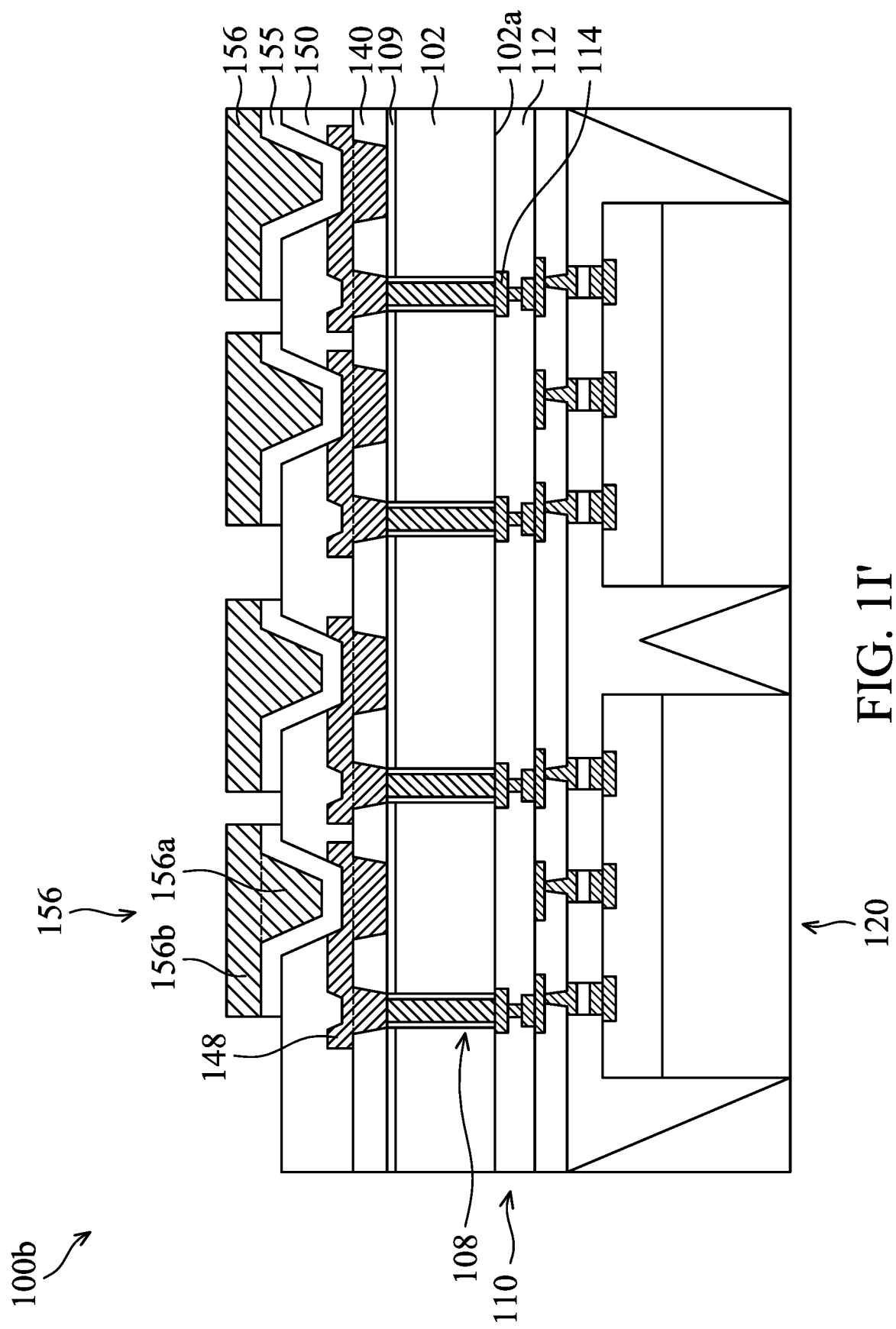

Next, as shown in FIG. 1I, an under bump metallurgy (UBM) layer 155 is formed in the third opening 151, and a conductive connector 156 is formed over the UBM layer 155, in accordance with some embodiments of the disclosure. The UBM layer 155 is directly over the second via portion 148c of the conductive structure 148. The conductive connector 156 is electrically connected to the conductive structure 148 by the UBM layer 155. The conductive connector 156 overlaps a portion of the through via structure 108.

The UBM layer 155 may be made of conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 155 may contain an adhesion layer and/or a wetting layer. In some embodiments, the UBM layer 155 further includes a copper seed layer. In some embodiments, the UBM layer 155 includes an adhesion layer made of Ti/Cu and a wetting layer made of Cu. In some embodiments, the UBM layer 155 is formed by a plating process, such as an electrochemical plating process or an electroless process.

In some embodiments, the conductive connector 156 is made of a metal layer, such as copper, copper alloy, nickel, nickel alloy, aluminum, aluminum alloy, tin, tin alloy, lead, lead alloy, silver, silver alloy or a combination thereof. In some embodiments, the conductive connector 156 is formed by a plating process, such as an electrochemical plating process or an electroless process.

The conductive connector 156 includes a protruding portion 156a and a top portion 156b. The protruding portion 156a is formed in the third opening 151, and the top portion 156a is formed over the protruding portion 156b. The protruding portion 156a is extended toward to the interconnect structure 110 and the through via structure 108. The protruding portion 156a is embedded in the first passivation layer 140. The dot line shown in FIG. 1I is drawn to provide a better understanding of the structure, but there is no actual interface or boundary between the protruding portion 156a and the top portion 156b.

Since the conductive structure 148 and the first passivation layer 140 are made of different material, the coefficient of thermal expansion (CTE) of the conductive structure 148 is mismatch that of the first passivation layer 140. As the size of the package structure 100a minimizes, the CTE difference between the materials of a structure, e.g., passivation layers and conductive structure (RDLs), causes the stress accumulated in the conductive structure/passivation layer interface. In addition, since the conductive connector 156 is offset with respect to the through via structure 108, the stress on a first region, which is directly over the through via structure 108 and the stress on a second region, which is directly below conductive connector 156 are different and are not balanced. This unbalanced stress may cause the conductive structure to crack or voids to develop in the passivation layer during the packaging process.

It should be noted that since the through via structure 108 is not aligned with the conductive connector 156, the second via portion 148c is directly below the conductive connector 156 to use as a support and to balance the stress. More specifically, the second via portion 148c is directly below the protruding portion 156a of the conductive connector 156 to reduce the stresses. Therefore, cracking is prevented and the reliability of the package structure 100a is improved.

FIG. 1I' shows a cross-sectional representation of a package structure 100b, in accordance with some embodiments of the disclosure. The package structure 100b is similar to, or the same as, the first package structure 100a shown in FIG. 1I, except that an insulation layer 109 is formed between the substrate 102 and the first passivation layer 140. Processes and materials used to form the package structure 100b may be similar to, or the same as, those used to form the package structure 100a and are not repeated herein.

As shown in FIG. 1I', the insulation layer 109 provides the insulation. It should be noted that no conductive material or layer is directly below or in direct contact with the second via portion 148c of the conductive structure 148. The bottom surface of the second via portion 148c is in direct contact with the insulation layer 109. In some embodiments, the insulation layer is made of silicon nitride or silicon oxide.

Figure 4A:
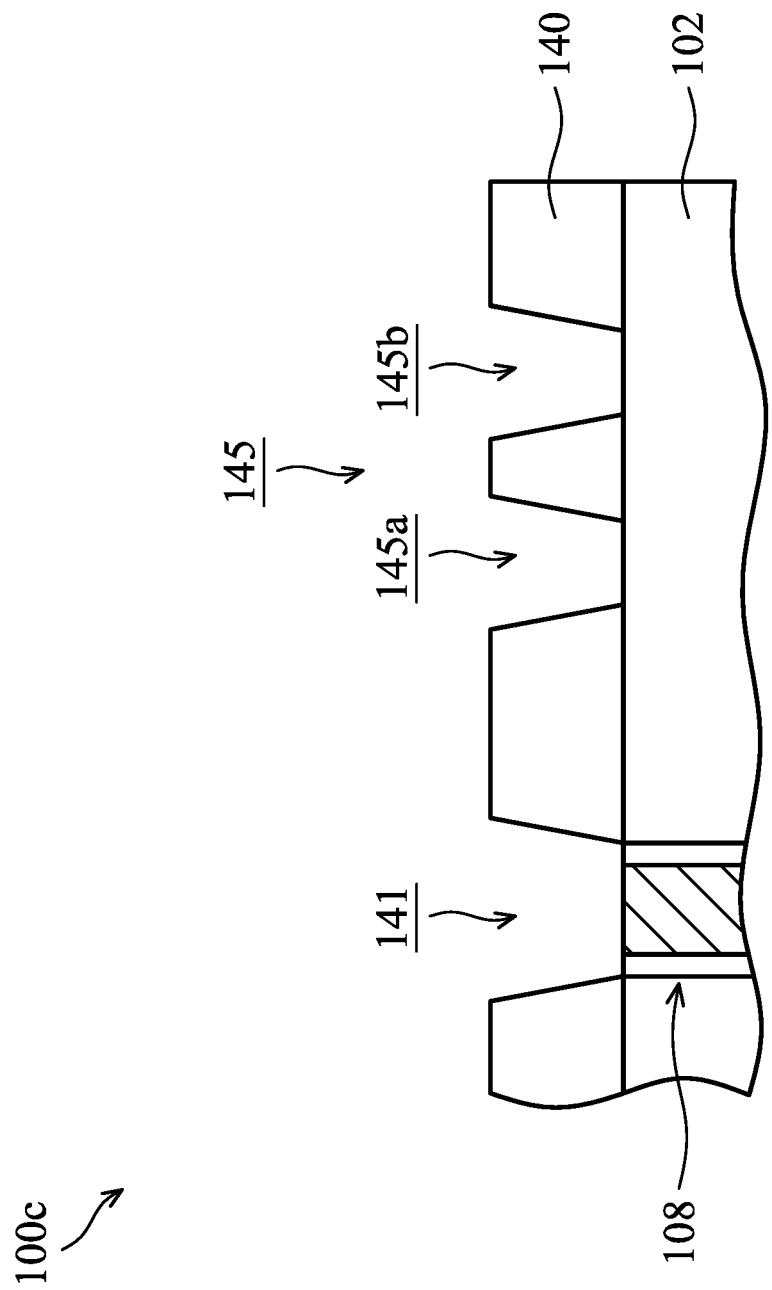
FIG. 4A-4B show cross-sectional representations of various stages of forming the first portion and the second portion of the conductive structure of a package structure, in accordance with some embodiments of the disclosure.
Figure 4B:
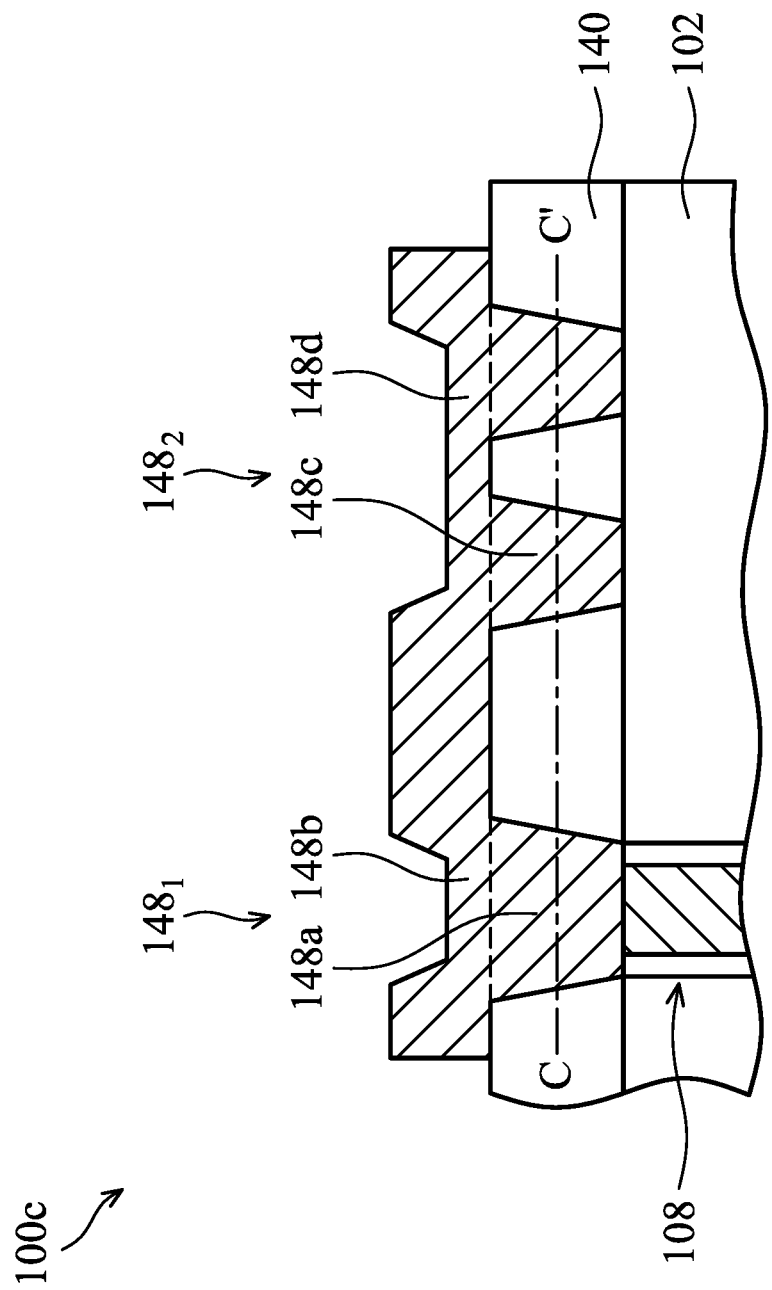

FIG. 4A-4B show cross-sectional representations of various stages of forming the first portion $148_1$ and the second portion $148_2$ of the conductive structure 148 of a package structure 100c, in accordance with some embodiments of the disclosure. The package structure 100c is similar to, or the same as, the first package structure 100a shown in FIG. 1I, except that the top-view shape of the second via portion 148c has a ring-shape.

As shown in FIG. 4A, the first opening 141 and the second opening 145 are formed in the first passivation layer 140. The second opening 145 has a first portion 145a and a second portion 145b, and the first portion 145a is connected to the second portion 145b to form a ring shape when seen from a top-view.

Afterwards, as shown in FIG. 4B, the conductive material is formed in the first opening 141 and the second opening 145 to form the conductive structure 148, in accordance with some embodiments of the disclosure.

The conductive structure 148 includes a first portion $148_1$ and a second portion $148_2$. The first portion $148_1$ includes a first via portion 148a in the first opening 141, and a first metal portion 148b on the first via portion 148a. The second portion $148_2$ includes a second via portion 148c in the second opening 145, and a second metal portion 148d on the second via portion 148c. The dot line shown in FIG. 1G is drawn to provide a better understanding of the structure, but there is no actual interface or boundary between the first via portion 148a and the first metal portion 148b, and between the second via portion 148c and the second metal portion 148d.

FIG. 4C shows a top-view representation of the first via portion 148a and the second via portion 148c taken along line C-C' of FIG. 4B, in accordance with some embodiments of the disclosure. As shown in FIG. 4C, the second via portion 148c has a ring shape when seen from a top-view.

Figure 5A:
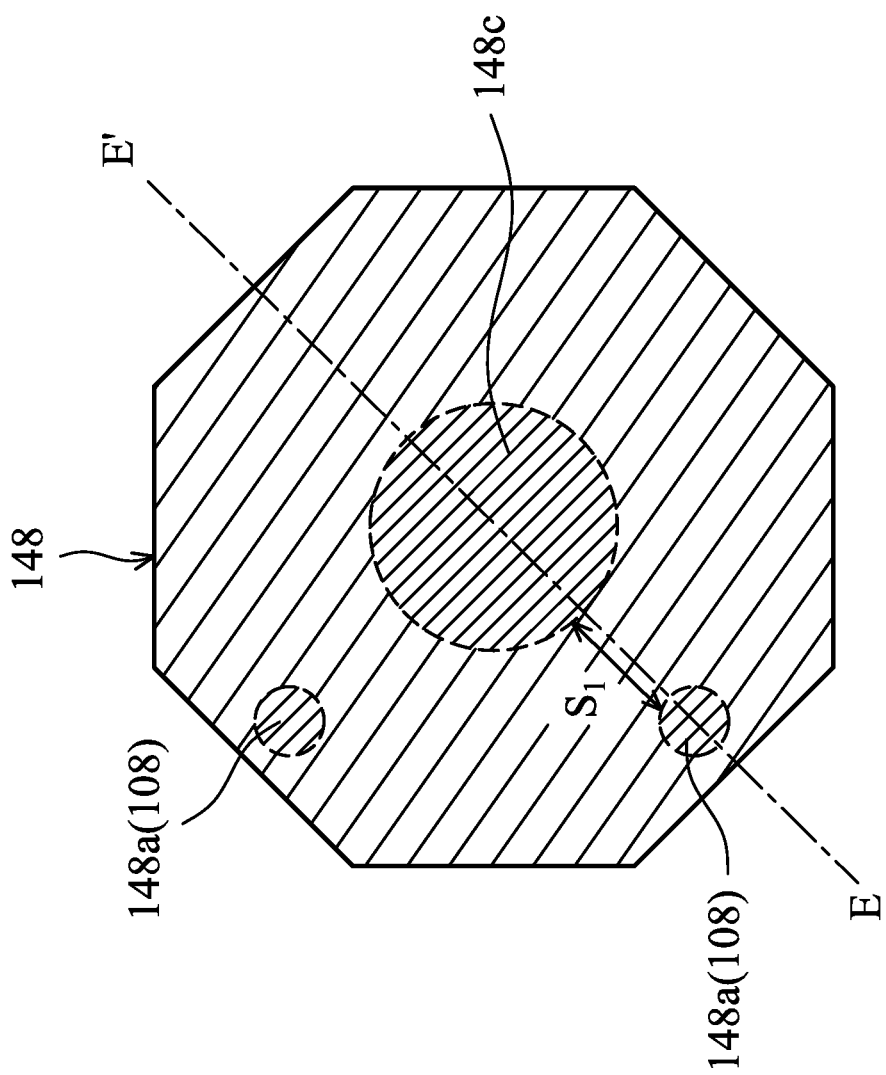
FIG. 5A shows a top-view representation of the conductive structure, in accordance with some embodiments of the disclosure.

FIG. 5A shows a top-view representation of the conductive structure 148, in accordance with some embodiments of the disclosure. FIG. 1G shows a cross-sectional representation of the package structure 100a taken along line E-E' of FIG. 5A, in accordance with some embodiments of the disclosure.

As shown in FIG. 5A, the through via structure 108 (the dot line) has a circular shape, the first via portion 148a (the dot line) has a circular shape, and the second via portion 148c (the dot line) has a circular shape when seen from a top-view. There is a first distance S1 between the first via portion 148a and the second via portion 148c. The bottom surface of the first via portion 148a is in direct contact with the through via structure 108, and the bottom surface of the second via portion 148c is in direct contact with the substrate 102.

Figure 5B:
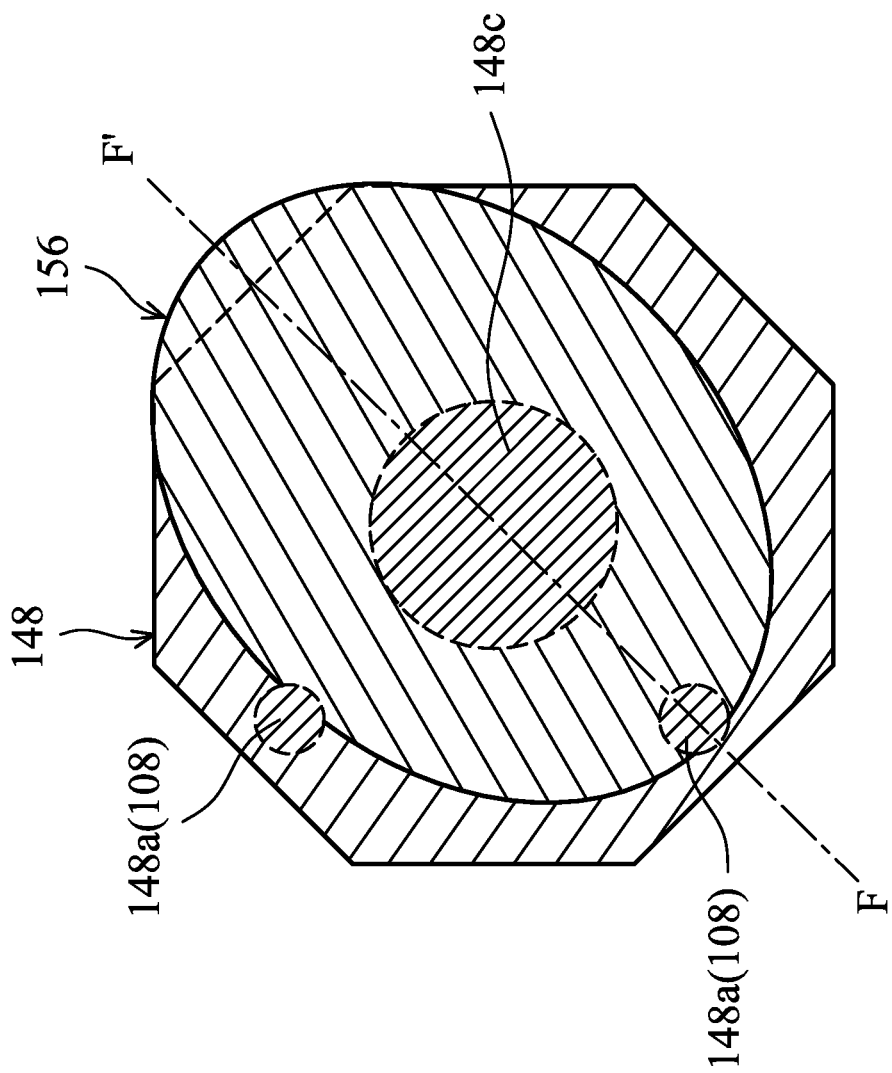
FIG. 5B shows a top-view representation of positional relationship between the conductive structure and the conductive connector, in accordance with some embodiments of the disclosure.

FIG. 5B shows a top-view representation of positional relationship between the conductive structure 148 and the conductive connector 156, in accordance with some embodiments of the disclosure. FIG. 1I shows a cross-sectional representation of the package structure 100a taken along line F-F' of FIG. 5B, in accordance with some embodiments of the disclosure.

As shown in FIG. 5B, the conductive connector 156 is formed over the conductive structure 148. The conductive structure 148 has an octagonal shape, and the conductive connector 156 has an oval shape. The second via portion 148c is located at about a central position related to the conductive connector 156. The first via portion 148a is located at an edge position related to the conductive connector 156. The size of the second via portion 148c is greater than the size of the first via portion 148a. The formation of the second via portion 148c is used to prevent the stress accumulated on some region and therefore to reduce the stress.

In some embodiments, there are two first via portions 148a below the conductive structure 148. One of the first via portions 148a is completely covered by the conductive connector 156, and the other of the first via portions 148a is partially covered by the conductive connector 156. In some embodiments, the conductive structure 148 covers two first via portions 148a and one second via portion 148c. The number of first via portions 148a may be greater than two and may be adjusted according to the actual application.

There is a ratio of the area of the second via portion 148c to the area of the conductive connector 156 is in a range from about 30% to about 70%. When the ratio is within above-mentioned range, the stress can be reduced to effectively prevent the formation of cracks and voids. In addition, since the larger conductive connector 156 will transfer more stress from the substrate 102, the ratio of the area of the second via portion 148c to the area of the conductive connector 156 should be designed within above-mentioned range to reduce the stress without affecting the routing.

FIGS. 6A-6E show cross-sectional representations of various stages of forming the package structure 100d, in accordance with some embodiments of the disclosure.

Figure 6A:
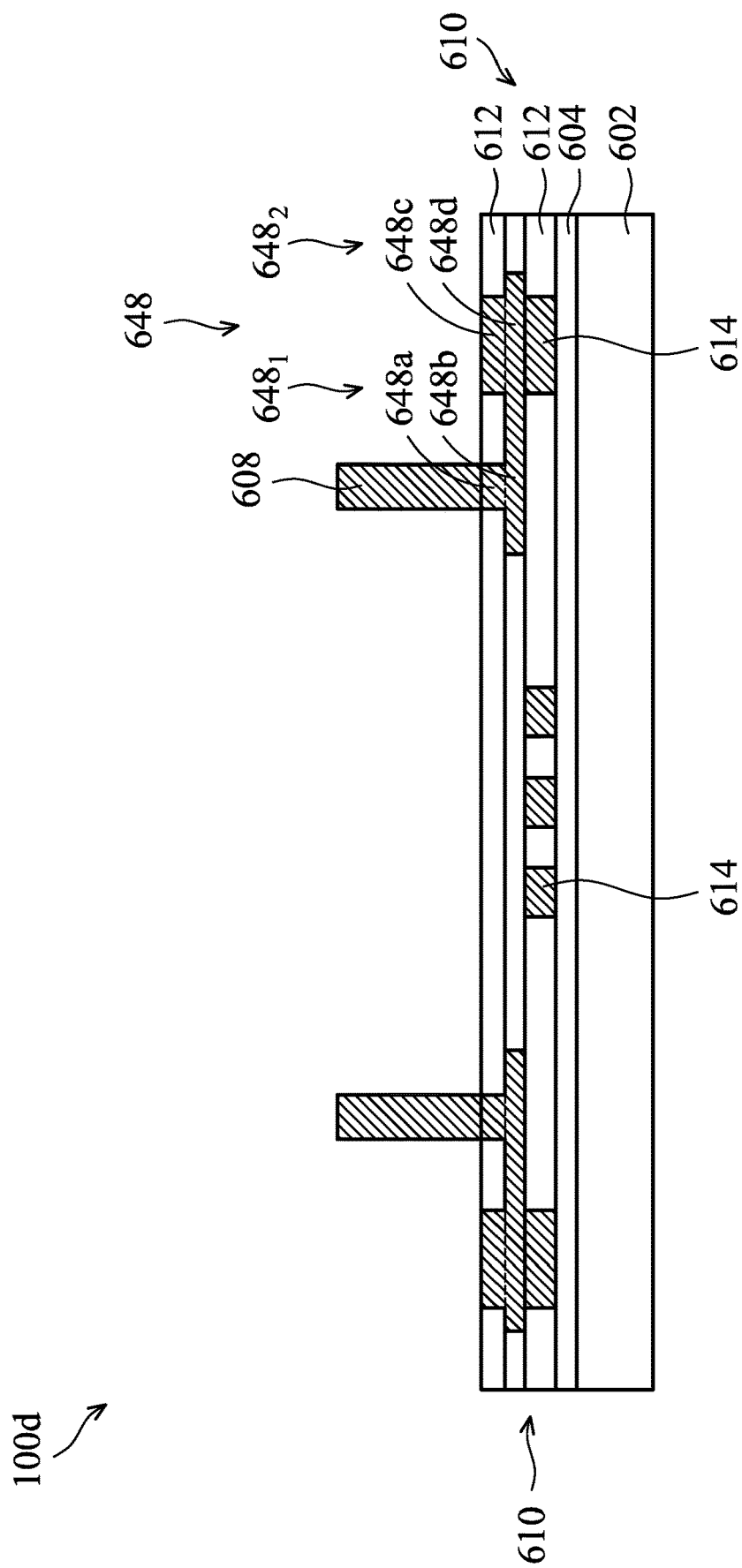
FIGS. 6A-6E show cross-sectional representations of various stages of forming the package structure, in accordance with some embodiments of the disclosure.

As shown in FIG. 6A, a passivation layer 604 is formed over a substrate 602. In some embodiments, the substrate 602 is used as a temporary substrate. The temporary substrate provides mechanical and structural support during subsequent processing steps, such as those described in more detail later. The substrate 602 is made of a semiconductor material, ceramic material, polymer material, metal material, another suitable material, or a combination thereof. In some embodiments, the substrate 602 is a glass substrate. In some other embodiments, the substrate 602 is a semiconductor substrate, such as a silicon wafer.

The passivation layer 604 is deposited or laminated on the substrate 602 by an adhesive layer (not shown). The passivation layer 604 provides structural support for bonding an integrated circuit die, which will be described in more detail later, and helps reduce die shifting issues. In some embodiments, the passivation layer 604 is a polymer layer or a polymer-containing layer. The passivation layer 604 is a poly-p-phenylenebenzobisthiazole (PBO) layer, a polyimide (PI) layer, a solder resist (SR) layer, an Ajinomoto buildup film (ABF), a die attach film (DAF), another suitable layer, or a combination thereof.

An interconnect structure 610 is formed over the first passivation layer 604. The interconnect structure 610 may be used as a redistribution (RDL) structure for routing. The interconnect structure 610 includes multiple conductive layers 614 formed in multiple passivation layers 612. A conductive structure 648 is formed in the passivation layers 612. The conductive structure 648 includes a first portion $648_1$ and a second portion $648_2$. The first portion $648_1$ includes a first via portion 648a and a first metal portion 648b. The second portion $648_2$ includes a second via portion 648c and a second metal portion 648d.

Afterwards, a through via structure 608 is physically and electrically connected to the first via portion 648a of the conductive structure 648. In some embodiments, the through via structure 608 is referred to as through interposer vias (TIVs).

In some embodiments, the through via structure 608 is made of copper (Cu), aluminum (Al), nickel (Ni), platinum (Pt), another suitable conductive material, or a combination thereof. In some embodiments, the through via structure 608 are formed using an electroplating process, a physical vapor deposition (PVD) process, a CVD process, an electrochemical deposition (ECD) process, a molecular beam epitaxy (MBE) process, an atomic layer deposition (ALD) process, or another applicable process.

Figure 6B:
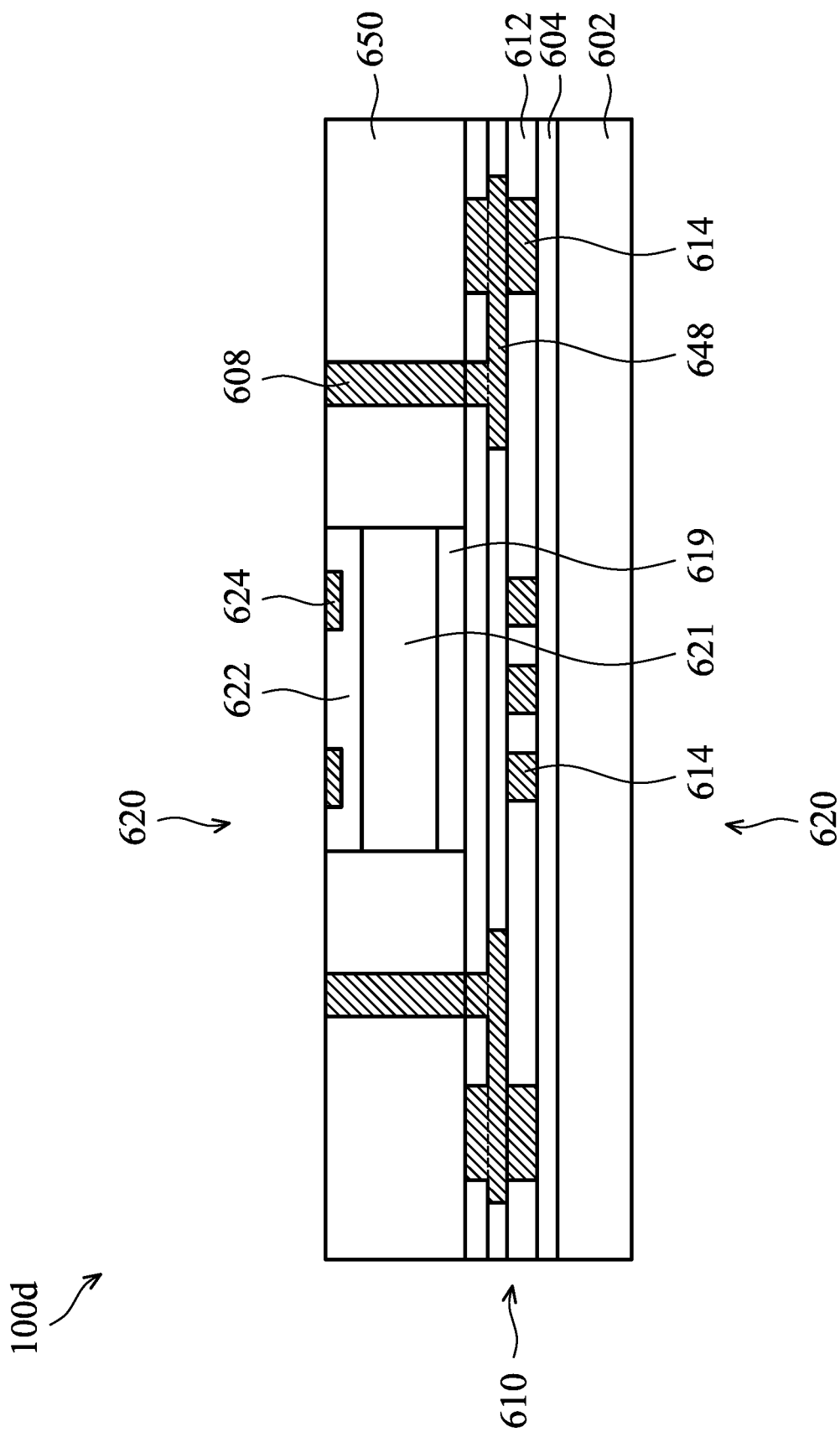

As shown in FIG. 6B, a semiconductor die 620 is disposed on the interconnect structure 610 by an adhesive film 619, in accordance with some embodiments. In some embodiments, the front side (the active surface) of the semiconductor die 620 faces away from the interconnect structure 610. The back side (the non-active surface) of the semiconductor die 620 faces the interconnect structure 610. Afterwards, a package layer 650 is deposited over the interconnect structure 610. As a result, the through via structure 608 and the semiconductor die 620 are encapsulated by the package layer 650.

The semiconductor die 620 includes a substrate 621, a passivation layer 622, and conductive pads 624. A variety of device elements may be formed in or over the substrate 621. The device elements include active devices and/or passive devices. In some other embodiments, the device elements include image sensor devices, logic devices, memory devices, other applicable types of devices, or a combination thereof.

The adhesive film 619 is used to bond or attach the semiconductor die 620 and the interconnect structure 610. The adhesive film 619 includes a die attach film (DAF), another suitable layer, or a combination thereof. In some embodiments, the package layer 650 includes a polymer material. In some embodiments, the package layer 650 includes a molding compound.

Figure 6C:
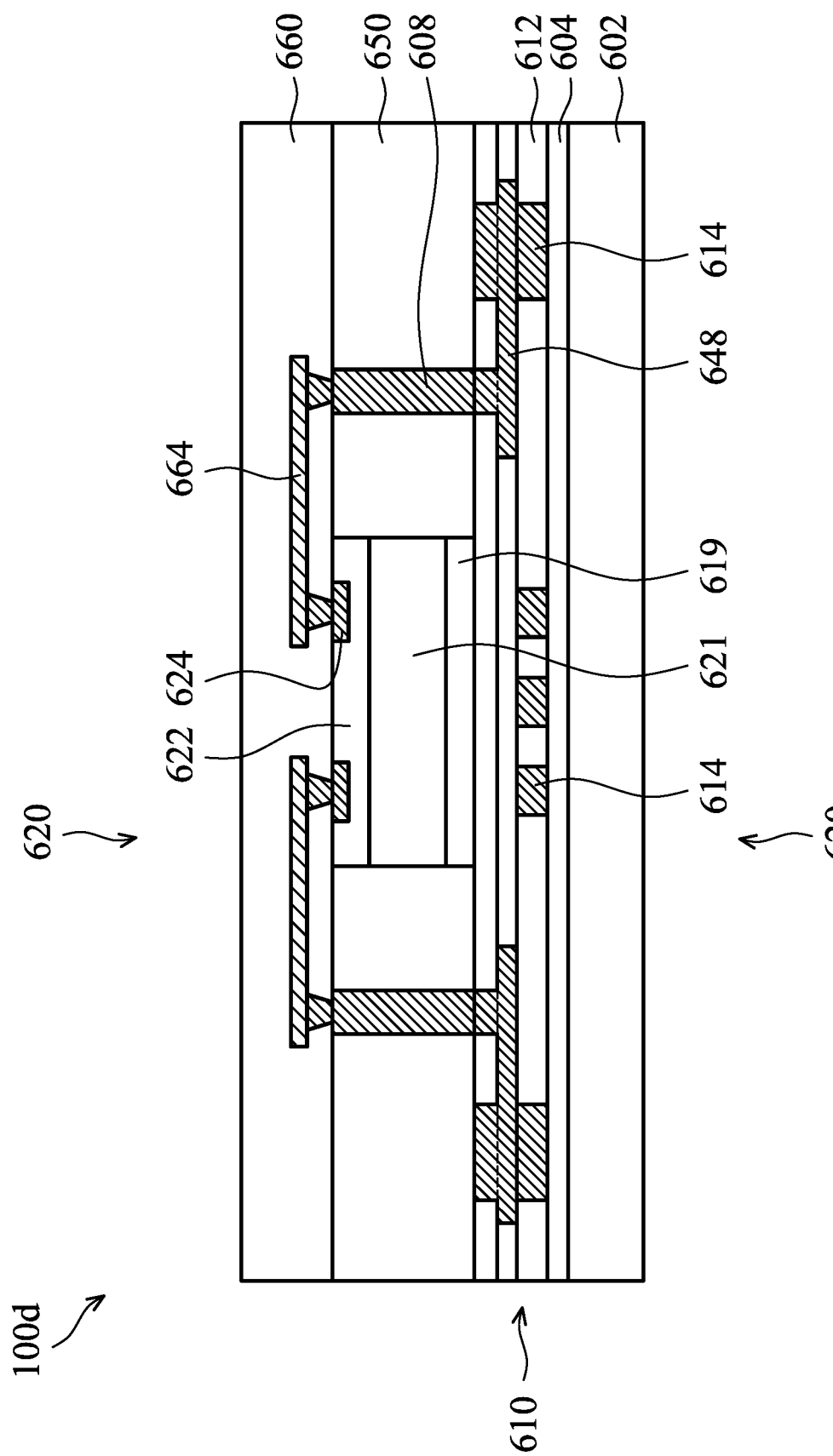

Afterwards, as shown in FIG. 6C, a passivation layer 660 is formed over the package layer 650, in accordance with some embodiments. A conductive layer 664 is formed and embedded in the passivation layer 660. The conductive layer 664 is electrically connected to the through via structure 608 and the semiconductor die 620. The passivation layer 660 is made of dielectric material(s) and provides stress relief for bonding stress incurred during subsequent bonding processes.

Figure 6D:
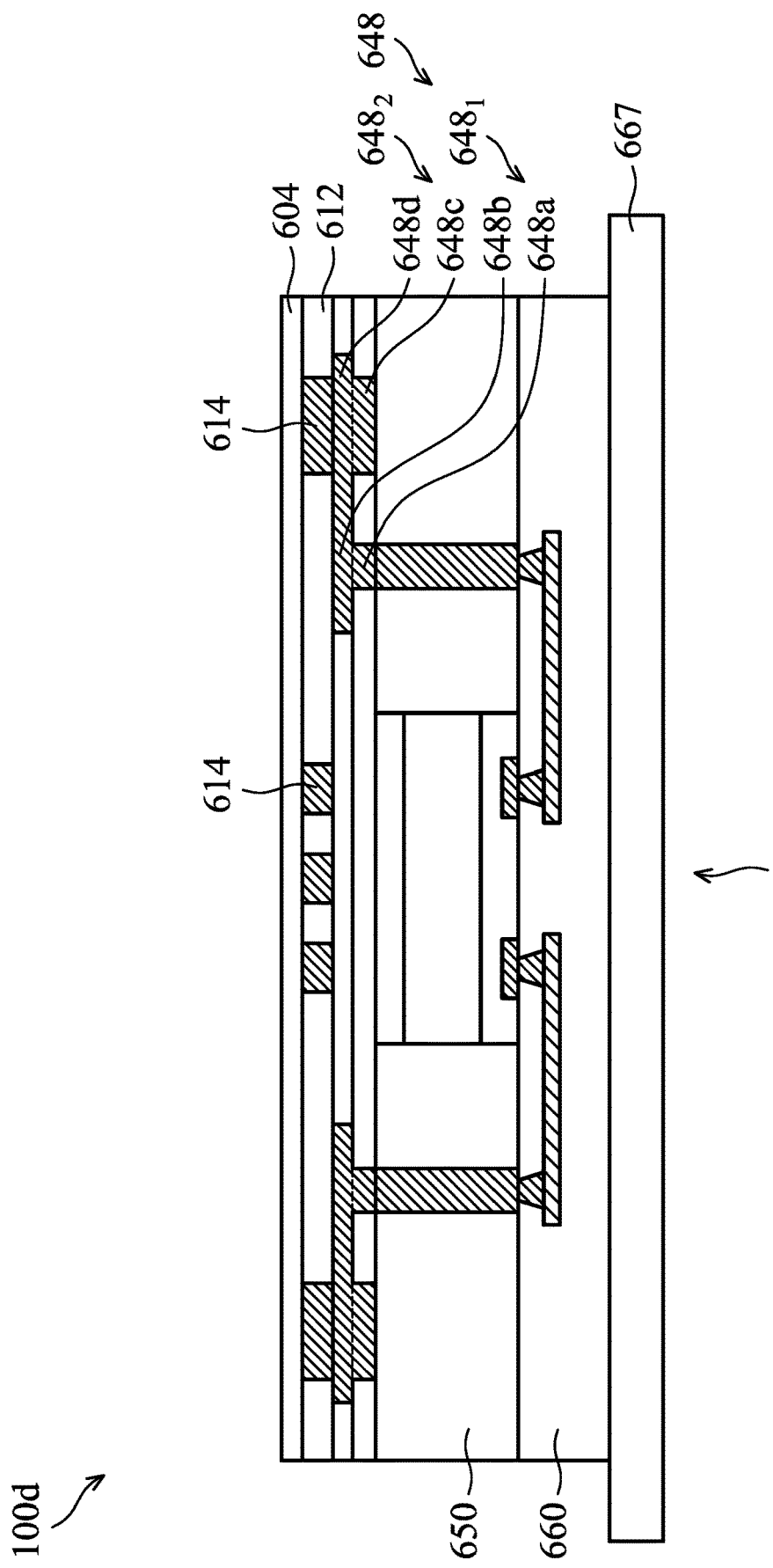

Next, as shown in FIG. 6D, the structure as shown in FIG. 6C is flipped and attached to a carrier substrate 667, in accordance with some embodiments. Afterwards, the substrate 102 is removed to expose the passivation layer 604.

Figure 6E:
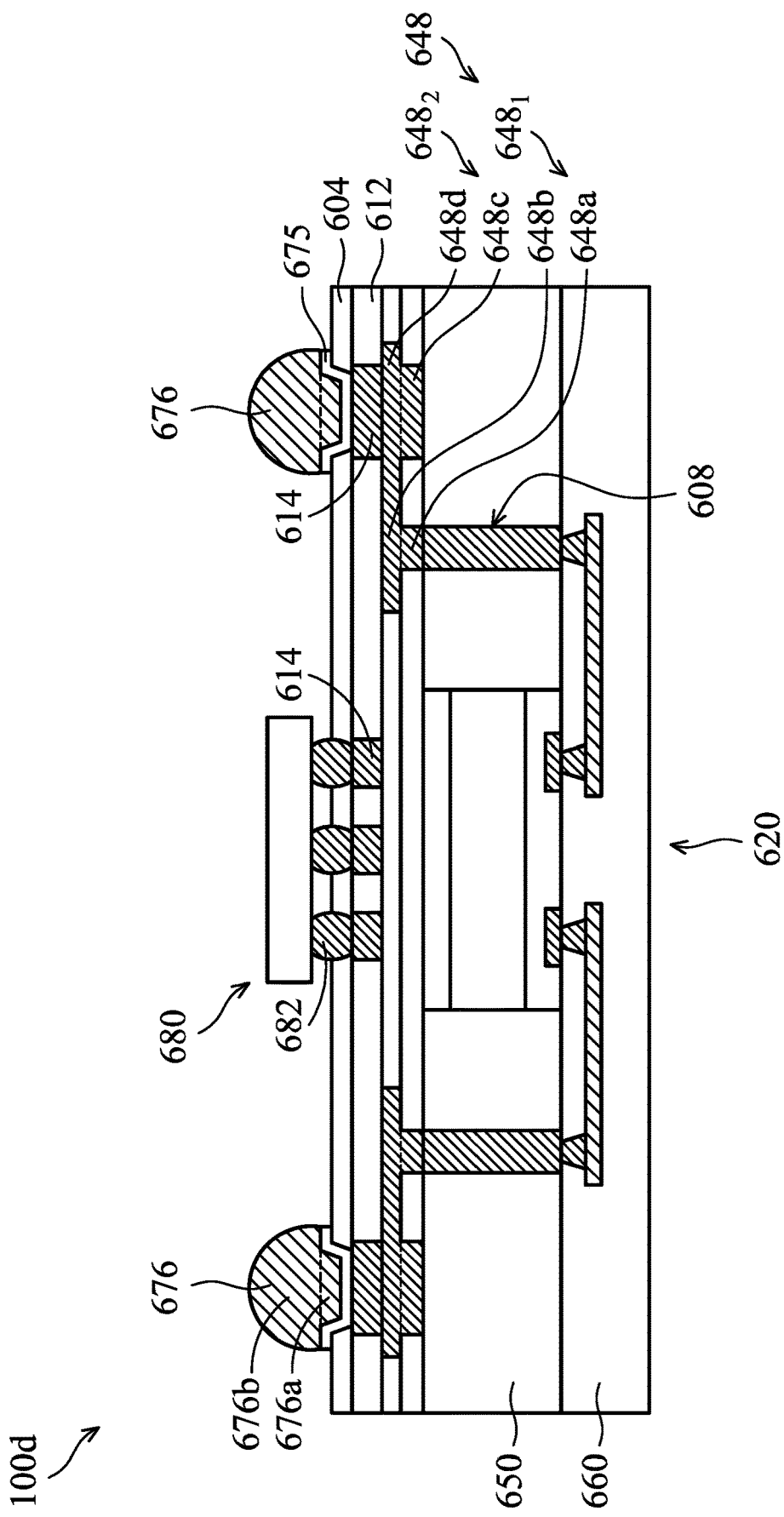

Afterwards, as shown in FIG. 6E, a UBM layer 675 is formed in the passivation layer 604 and a conductive connector 676 is formed over the UBM layer 675, in accordance with some embodiments. In addition, a semiconductor die 680 is formed over the passivation layer 604 by a conductive connector 682. In some embodiments, the conductive connector 676 has a height greater than that of the conductive connector 682.

The conductive connector 766 includes a protruding portion 676a and a top portion 676b formed over the protruding portion 156b. The protruding portion 676a is extended toward to the through via structure 608 and is embedded in the passivation layer 604. The dot line shown in FIG. 6E is drawn to provide a better understanding of the structure, but there is no actual interface or boundary between the protruding portion 676a and the top portion 676b.

The conductive connector 676 is electrically connected to the second via portion 648c by the conductive layer 614 and the second metal portion 648d. The second via portion 648c is electrically connected to the through via structure 608 by the second metal portion 648d, the first metal portion 648b and the first via portion 648a. The second via portion 648c has one end to connect the second metal portion 648d, and the other end is in direct contact with the package layer 650. There is no conductive material or layer is directly below and in direct contact with the second via portion 648c.

It should be noted that the formation of the second via portion 648c is used to prevent the stress accumulated on some region and therefore to reduce the stress. The second via portion 648c provides a reliable support. Therefore, cracks and voids are prevented from forming, and the reliability of the package structure 100a is improved.

Embodiments for forming a package structure and method for formation the same are provided. The package structure includes a through via structure formed in a substrate. A semiconductor die is formed below the through via structure, and a conductive structure is formed over the substrate. The conductive structure includes a first portion and a second portion. The first portion includes a first via portion and a first metal portion. The second portion includes a second via portion and a second metal portion. A conductive connector is formed on the conductive structure. The first via portion is directly formed on the through via structure, and the bottom surface of the second via portion is direct contact with the substrate. The second via portion is used as a support to reduce the stress. The cracks and voids can be reduced. Therefore, the quality, the yield and reliability of the package structure are improved.

In some embodiments, a package structure is provided. The package structure includes a first through via structure formed in a substrate and a semiconductor die formed below the first through via structure. The package structure further includes a conductive structure formed in a passivation layer over the substrate. The conductive structure includes a first via portion and a second via portion, the first via portion is directly over the first through via structure, and no conductive material is directly below and in direct contact with the second via portion.

In some embodiments, a package structure is provided. The package structure includes a through via structure formed in a package layer and a first semiconductor die formed adjacent to the through via structure. The package structure includes a first via portion directly on the through via structure and a second via portion adjacent to the first via portion. The second via portion has a first end and a second end in a vertical direction, the first end is in direct contact with the package layer. The package structure also includes a first line portion formed on the first via portion, and a second line portion formed on the second via portion. The first line portion is connected to the second line portion, and the second end of the second via portion is in direct contact with the second line portion. The package structure further includes a connector formed on the second metal portion, and the connector includes a protruding portion, and the second via portion is directly below the protruding portion of the connector.

In some embodiments, a method for forming a package structure is provided. The method includes forming a through via structure in a substrate and forming a semiconductor die below the substrate. The method further includes forming a first passivation layer over the substrate and forming a first opening and a second opening in the first passivation layer. The first opening exposes the through via structure, and the second opening exposes the substrate, the first opening has a circular shape when seen from a top-view, and the second opening has a circular shape when seen from a top-view. The method also includes forming a conductive material in the first opening and the second opening, and over the first passivation layer to form a conductive structure. The conductive structure includes a first via portion in the first opening, and a second via portion in the second opening. The first via portion is directly over the through via structure, and the bottom surface of the second via portion is direct contact with the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a through via structure formed in a package layer;
   a first semiconductor die formed adjacent to the through via structure;
   a first via portion directly on the through via structure;
   a second via portion adjacent to the first via portion, wherein the second via portion has a first end and a second end in a vertical direction, and the first end is in direct contact with the package layer;
   a first line portion formed on the first via portion;
   a second line portion formed on the second via portion, wherein the first line portion is connected to the second line portion, and the second end of the second via portion is in direct contact with the second line portion; and
   a connector formed on the second via portion, wherein the connector comprises a protruding portion, and the second via portion is directly below the protruding portion of the connector.

2. The package structure as claimed in claim 1, further comprising:
   an interconnect structure formed below the first semiconductor die, wherein the first via portion is electrically connected to the interconnect structure through the through via structure.

3. The package structure as claimed in claim 1, wherein a distance between the first via portion and the second via portion is smaller than a diameter of the second via portion.

4. The package structure as claimed in claim 1, further comprising:
   a second semiconductor die formed over the first semiconductor die, wherein the second semiconductor die is adjacent to the connector.

5. The package structure as claimed in claim 1, wherein the second via portion has a circular shape when seen from a top-view, and a diameter of the second via portion tapers gradually from the second end to the first end.

6. A package structure, comprising:
   a first semiconductor die formed in a package layer;
   a first via portion formed over the package layer;
   a second via portion adjacent to the first via portion, wherein the second via portion is in direct contact with the package layer; and
   a line portion formed over the first via portion and the second via portion, wherein the first via portion is electrically connected to the second via portion by the line portion.

7. The package structure as claimed in claim 6, further comprising:
   a through via structure formed in the package layer, wherein the through via structure is in direct contact with the first via portion.

8. The package structure as claimed in claim 6, further comprising:
   a second semiconductor die formed over the first semiconductor die.

9. The package structure as claimed in claim 8, further comprising:
   a first connector formed between the first semiconductor die and the second semiconductor die; and
   a second connector formed over the second via portion, wherein a top surface of the second connector is higher than a top surface of the first connector.

10. A package structure, comprising:
    a first semiconductor die formed in a package layer;
    a first via portion formed over the package layer;
    a second via portion adjacent to the first via portion, wherein the second via portion is in direct contact with the package layer;
    a line portion formed over the first via portion and the second via portion, wherein the first via portion is electrically connected to the second via portion by the line portion; and
    an under bump metallization (UBM) layer directly over the second via portion.

11. The package structure as claimed in claim 10, further comprising:
    a connector formed over the UBM layer, wherein the connector comprises a protruding portion, and the second via portion is directly below the protruding portion of the connector.

12. The package structure as claimed in claim 10, further comprising:
    a passivation layer formed below the package layer; and
    a conductive layer formed in the passivation layer.

13. The package structure as claimed in claim 12, further comprising:
  a through via structure formed adjacent to the first semiconductor die, wherein the through via structure is electrically connected to the conductive layer.

14. The package structure as claimed in claim 10, wherein the UBM layer is formed in a passivation layer.

15. The package structure as claimed in claim 14, further comprising:
  a second semiconductor die formed over the passivation layer, wherein the a top surface of the second semiconductor die is higher than a top surface of the UBM layer.

16. The package structure as claimed in claim 10, wherein a width of the line portion is greater than a width of the first via portion.

17. The package structure as claimed in claim 10, wherein the first semiconductor die comprises a substrate and a conductive pad, and the conductive pad is far away from the first via portion than the substrate.

18. The package structure as claimed in claim 10, wherein the second via portion has a circular shape when seen from a top-view.

19. The package structure as claimed in claim 10, wherein a bottom surface of the first via portion is leveled with a bottom surface of the second via portion.

20. The package structure as claimed in claim 10, wherein the second via portion is separated from the first via portion by a passivation layer in the same horizontal level.

* * * * *